United States Patent [19]
Igarashi

[11] Patent Number: 6,107,656
[45] Date of Patent: Aug. 22, 2000

[54] FERROELECTRIC TRANSISTORS, SEMICONDUCTOR STORAGE DEVICES, METHOD OF OPERATING FERROELECTRIC TRANSISTORS AND METHOD OF MANUFACTURING FERROMAGNETIC TRANSISTORS

[75] Inventor: Yasushi Igarashi, Tokyo, Japan

[73] Assignee: Oki Electric Industry Co., Ltd., Tokyo, Japan

[21] Appl. No.: 08/958,989

[22] Filed: Oct. 28, 1997

[30] Foreign Application Priority Data

Jun. 6, 1997 [JP] Japan ................................. 9-149273

[51] Int. Cl.⁷ .................................................. H01L 29/76
[52] U.S. Cl. .......................... 257/295; 257/316; 365/145
[58] Field of Search ................................... 257/295, 316; 365/145

[56] References Cited

U.S. PATENT DOCUMENTS

| | | | |
|---|---|---|---|
| 5,384,729 | 1/1995 | Sameshima | 365/145 |
| 5,789,775 | 8/1998 | Evans, Jr. et al. | 257/295 |

OTHER PUBLICATIONS

Y. Katoh, S. Fujeda, Y. Hayashi, and T. Kunio, "Non–Volatile FCG (Ferroelectric–Capacitor and Transistor–Gate Connection) Memory Cell with Non–Destructive Read–Out Operation", 1996 Symposium on VLSI Technology Digest of Technical Papers, pp. 56–57.

P. Mei, J. B. Boyce, M. Hack, R. Lujan, S. E. Ready, D. K. Fork, R. I. Johnson, and G. B. Anderson, "Grain Growth in Laser Dehydrogenated and Crystallize Polycrystalline Silicon for Thin Film Transistors", 1994 American Institute of Physics, May 20, 1994, pp. 3194–3199.

K. Sugibuchi, Y. Kurogi, and N. Endo, "Ferroelectric Field–Effect Memory Device Using $Bl_4Ti_3O_{12}$ Film", 1975 American Institute of Physics, Jul. 1975, pp. 2877–2881.

*Primary Examiner*—Mahshid Saadat
*Assistant Examiner*—George C. Eckert, II
*Attorney, Agent, or Firm*—Wenderoth, Lind & Ponack, L.L.P.

[57] ABSTRACT

A method of manufacturing a ferroelectric transistor is provided by which the characteristic of the transistor is not degraded because of a heated process. The ferroelectric transistor has a gate unit on the underlying structure. The gate unit includes a gate electrode, a ferroelectric film and a gate insulation film deposited on one another in this order. A channel layer is provided on the gate insulation film. A first main electrode and a second main electrode are provided in a spaced apart manner on the channel layer. The channel layer is used as a channel in operating the transistor. Thus, the carrier density of the channel is controlled by using the spontaneous polarization of the ferroelectric film.

18 Claims, 19 Drawing Sheets

Hysteresis Characteristics of $SrBi_2Ta_2O_9$

FERROELECTRIC TRANSISTORS, SEMICONDUCTOR STORAGE DEVICES, METHOD OF OPERATING FERROELECTRIC TRANSISTORS AND METHOD OF MANUFACTURING FERROMAGNETIC TRANSISTORS

BACKGROUND OF THE INVENTION

1. Field of the Invention

The invention relates to ferroelectric transistors which are suitable for integrating an integrated circuit to a higher degree and operating an integrated circuit with a greater speed and to a manufacturing method thereof.

2. Description of the Prior Art

Research and Development of semiconductor storage devices which are non-volatile and implemented with ferroelectric material have been actively pursued. For example, a device called an MFSFET has been proposed. This FET (Field Effect Transistor) is constructed in an MFS (Metal/Ferroelectric/Semiconductor) structure wherein a semiconductor, a ferroelectric and a metal are sequentially deposited. This device has a simple structure so that it can be readily reduced in its size. Additionally, data stored in this device may be read out in a speedy and undestructive manner. It is, however, difficult to appropriately control the boundary (or interface) between the ferroelectric and the semiconductor of this device in manufacturing it. In other words, a high quality boundary is difficult to accomplish. Thus, so far, this type of device has not yet been brought into market.

An FCG (Ferroelectric-Capacitor and transistor-Gate connection) device has also been proposed. For more details, see "1996 Symposium on VLSI Technology Digest of Technical Papers," pp. 56 to 57, 1996. This publication is hereby incorporated by reference. An FCG device is constructed in such a manner that each of a ferroelectric capacitor and a MOSFET (Metal/Oxide/Semiconductor FET)is provided in a separate location on an underlying layer or supporting layer and that the ferroelectric capacitor and the gate electrode of the MOSFET are locally wired. Thus, since a ferromagnetic portion is not formed on the semiconductor, the above-mentioned quality problem of the interface does not occur. Further, the ratio between the electric capacitance of the ferroelectric capacitor and gate capacity can be relatively freely set up by changing the size of the ferroelectric film or the gate isolating film. Accordingly, it is easy to apply a voltage to the ferroelectric capacitor so as to inverse the polarization of the ferroelectric. However, its reduction in size is not easy because of the complexity in structure as opposed to the case of an MFS-FET.

As discussed above, it is difficult to appropriately control the interface between the ferroelectric and the semiconductor of an MFSFET in its manufacture. On the other hand, an FCG device has a disadvantage that it can not readily be reduced in its size. In order to overcome these problems, an MFMISFET has been proposed. An MFMISFET is constructed in such a manner that an MFM (Metal/Ferroelectric/Metal) structure, which comprises a ferroelectric film is sandwiched by a pair of metal films from both sides, is provided on the gate electrode of a MOSFET. Thus, the gate portion of this device has an MFMIS (Metal/Ferroelectric/Metal/Insulator/Semiconductor) structure. Since this structure has a ferroelectric film formed on a metallic film, a good interface can be achieved. Reduction in its size is also easily done. However, this MFMISFET has following disadvantages:

(1) A ferroelectric film has to be formed by means of a heated process at such a high temperature of approximately 800° C. This results in an outer diffusion of the elements constituting the ferroelectric so that channel regions are contaminated, thereby degrading the characteristics of the MOSFET device.

(2) A wiring or an interconnection layer is formed above the MFMISFET, which necessitates an interlayer insulation film or an interlayer dielectric film on the MFMISFET in order to electrically isolate the wiring layer from the underlying conductor. Thus, if a thermal distortion occurs at the interlayer insulation layer, a relatively large stress is generated onto the ferroelectric film, which degrades the characteristics of the ferroelectric. As a (thermal) stress is also generated in the course of a thermal or heating process (or heat treatment), the number of thermal processes should preferably be kept to as minimum as possible once the ferroelectric film is formed.

(3) A heated process in a hydrogen gas is sometimes necessary so as to restore the damage on the MOSFET (for example, crystal defects caused by an ion implantation). In such an instance, a reductive reaction of the ferroelectric film sometimes occurs, thereby degrading the characteristics of the ferroelectric material.

The above-described problems are due to the thermal processes.

Accordingly, objects of the present invention are to provide a ferroelectric transistor having a characteristic which is not degrated in the course of a thermal process, and the manufacturing method of the transistor.

SUMMARY OF THE INVENTION

Thus the ferroelectric transistor in accordance with the present invention includes a gate electrode, a ferroelectric film, a gate insulation film, a first main electrode and a second main electrode. The ferroelectric transistor comprises a gate unit (or gate portion or gate structure) having the gate electrode, the ferroelectric film and the gate insulation film deposited on an underlying or supporting layer in this order, and a channel layer deposited on the gate insulation film; wherein the first and second main electrodes are formed as being spaced apart from each other on or in the channel layer; and wherein the channel layer is used as a channel which controls the carrier density by means of the spontaneous polarization of the ferroelectric film.

The above-mentioned gate unit and channel layer correspond to the MFMIS structure in a conventional ferroelectric transistor, for example, an MFMISFET. However, as opposed to the conventional MFMIS structure where a semiconductor substrate, a gate insulation film, a ferroelectric film and a gate electrode are deposited on an underlying structure in this order , the structure of this invention has a gate electrode, a ferroelectric film, a gate insulation film and a channel layer (which corresponds to the above-mentioned semiconductor substrate) in this order. On or in this channel layer a first and a second main electrodes are provided.

Accordingly, pursuant to the device structure of this invention, the following advantages are achieved:

(1) Since a ferroelectric film is formed prior to a channel layer, the elements constituting the ferromagnetic material do not diffuse in an outer direction despite a thermal process or heat treatment. In other words, this channel layer does not substantially contain, in the layer, the constituting elements of the ferroelectric otherwise existing because of a thermal diffusion. Therefore, the degradation of the MOSFET's characteristic is restrained.

(2) Data may be written into and erased from the device by applying a voltage across either of the first or second main electrode and the gate electrode. Thus the direction of the spontaneous polarization can be controlled. Data may be read out of the device by applying a voltage across the first and second main electrodes. In this instance, the difference in the current flowing in the channel in response to the direction of the spontaneous polarization of the ferroelectric film can be detected as data. In other words, as discussed above, the carrier density of the channel formed on the channel layer by means of the spontaneous polarization of the ferroelectric film is thus controlled.

As seen above, the device of this invention can be operated via three electrode terminals. This means that it is no longer necessary to control the substrate potential (indicating the substrate bias or back-gate), which was required in prior art devices. Thus, wiring or interconnecting process is far simplified compared to prior art devices and the device can be controlled more easily.

(3) The device of this invention has a simple structure with a gate electrode, a ferroelectric film, a gate insulation film and a channel layer deposited in a sequential manner, which facilitates the reduction in the size of the device, that is, the formation of a fine structure of the device.

As understood from the above description, in accordance with the present invention, the diffusion, associated with a heat treatment, of the elements constituting the ferroelectric material can be suppressed. Further, the wiring (or interconnection) can be made simpler, thereby facilitating the reduction in size. Therefore, the device of this invention is quite suitable in achieving such an improved capability of a circuit as a further integration of an integrated circuit and a speed-up of the operation thereof.

Incidentally, the device of this invention is preferably formed of an insulation layer. Alternatively, the first and second main electrodes may be formed by depositing a conductive layer on a channel layer or by doping the channel layer with impurities.

In accordance with an embodiment of the invention, the channel layer is preferably formed of amorphous silicon or polysilicon. These may be formed by means of such relatively low temperature processes as a plasma chemical vapor deposition (CVD), sputtering, an electron beam deposition. Also an appropriate conductivity may be given as desired. The amorphous silicon or polysilicon is used as a channel layer of a thin film FET. For more details, see papers in Journal of Applied Physics, Vol. 76, No. 5, p. 3194, September, 1994 and Extended Abstracts of the 1991 International Conference on Solid State Devices and Materials, Yokohama, 1991, pp. 174 to 176. These publications are hereby incorporated by reference.

Further, in accordance with an embodiment of the invention, the gate insulation film is preferably formed of any one material or any combination of more than one material selected from among $Ta_2O_5$, $ZrO_2$, $HfO_2$, $Si_3N_4$, $CeO_2$ and $Ba_xSr_{1-x}TiO_3$ (x is a positive integer). The relative dielectric constants of all these materials are greater than that of $SiO_2$, which is normally used as a gate insulation layer. Thus it is possible to apply a higher voltage to the ferroelectric film than in the case of prior art devices.

Alternatively, the ferroelectric layer is preferably formed of any one material selected from among $SrBi_2Ta_2O_9$, $PbZrTiO_3$, $Ba_xSr_{1-x}TiO_3$ (x is a positive integer), $Pb_5Ge_3O_{11}$, $Bi_4Ti_3O_{12}$ and $(Pb, La)TiO_3$. These ferroelectric films may be formed, for example, by means of sol-gel method.

Further, in accordance with a preferred embodiment of the invention, the first and second main electrodes may be formed of polysilicon or amorphous silicon.

Further, in accordance with an embodiment of the invention, the gate electrode is preferably formed of any one material selected from among W, Ta, Mo, TiN, Nb, V, TaN, TaSiN, TiW, TiWN and TiAlN. Since the melting points of these materials are relatively high, little adverse effects are observed even in a heat treatment.

Further, in accordance with an embodiment of the invention, it is preferable that the underlying layer has a substrate and an interlayer insulation film deposited in this order and that the gate electrode is provided on the interlayer insulation film.

Further, in accordance with an embodiment of the invention, the gate unit preferably has a lower conductive layer between the ferroelectric film and the gate electrode. The lower conductive layer is primarily used as an underlying layer on the basis of which a ferroelectric film is formed. Thus the material thereof should be selected depending upon the ferroelectric film to be formed.

Accordingly, for example, the lower conductive layer is preferably formed of any one material or any combination of more than one material selected from among $IrO_2$, Ir, Ru, Pt, $RuO_2$, $SrRuO_3$, $La_{1-x}Sr_xCoO_3$ (x is a positive integer) and $SrMoO_3$.

Further in accordance with a preferred embodiment of the invention, the gate unit preferably has an upper conductive layer between the gate insulation film and the ferroelectric film. The upper conductive layer is primarily used to prevent the ferroelectric film from being degraded in a heat treatment. Thus the material thereof should be selected depending upon the ferroelectric film being used.

Accordingly, for example, the upper conductive layer is preferably formed of any one material or any combination of more than one material selected from among $IrO_2$, Ir, Ru, Pt, $RuO_2$, $SrRuO_3$, $La_{1-x}Sr_xCoO_3$ (x is a positive integer) and $SrMoO_3$.

And, in this case, the area of the portion where the first main electrode makes contact with the channel layer is different from that of the portion where the second main electrode makes contact with the channel layer. In other words, according to the present invention's structure, the area of such a portion that the first or second main electrode makes contact with the channel layer may be separately and appropriately defined.

As discussed above, according to the present structure, data may be written into and erased from the device by, for example, applying a signal voltage across the second main electrode and the gate electrode. In doing so, the first main electrode is left open. Thus, the signal voltage is applied to the gate insulation film at such a region on which the contacting portion between the second and channel layer is projected in the depositing direction (that is the direction in which the gate electrode, the ferroelectric film the gate insulation film and the channel layer are deposited). Therefore, the region of the gate insulation film onto which the signal voltage is applied varies in response to the area of the contacting portion between the second main electrode and channel layer.

On the other hand, since an upper conductive layer is provided between the gate insulation film and ferroelectric film, a signal voltage is applied to the ferroelectric film at such a region on which the contacting portion between the upper conductive layer and ferroelectric film is projected in the depositing order. Therefore, the region of the ferroelectric film onto which the signal voltage is applied is independent of the area of the contacting portion between the second main electrode and channel layer.

As being apparent from the above discussion, in accordance with the present structure, by appropriately setting up the area of the contacting portion between the second main electrode and channel layer, the electric capacity of the gate insulation film can be In effectively arranged. Thus the signal voltage to be applied to the ferroelectric film can be determined to a suitable level.

Also in accordance with a preferred embodiment of the invention, the gate unit has a metal oxide layer between the channel layer and the gate insulation layer. The metal oxide layer is formed of a material the heat of formation of the oxide of which is smaller than that of the channel layer.

For example, if the channel layer is a silicon (Si) layer, then the metal oxide layer is preferably formed of any one material or any combination of more than one material selected from among $ZrO_2$, $TiO_2$, $HfO_2$ and $Al_2O_3$.

Normally, an oxide is used as a gate insulation film. For example, as seen above, $Ta_2O_5$ may be used as a gate insulation film. Then, a channel layer is formed on this $Ta_2O_5$ film. The formation of, this channel film is done at a relatively high temperature condition. For example, if polysilicon layer is used as A channel layer, then the film is formed at approximately 600° C. Thus $Ta_2O_5$ is reduced by Si and $SiO_2$ is resulted. Accordingly, the permittivity (dielectric constant=$\epsilon$)of the gate insulation film is lowered and the voltage to be applied to the ferroelectric film is also lowered.

In accordance with the present structure, a metal oxide layer, for example, a $ZrO_2$ layer, is formed on a gate insulation layer and a channel layer is formed on this $ZrO_2$ layer. The generation free energy of the oxide is –170 kcal/g·mol $O_2$ (600° C.) in the case of Si and –220 kcal/g·mol $O_2$ (600° C.) in the case of $ZrO_2$. Since the generation free energy of $ZrO_2$ is larger than that of Si, $ZrO_2$ is a material that cannot be reduced with Si. Thus a gate insulation film can be made unreducible with Si by covering a gate insulation film with a metal oxide.

Next, a semiconductor storage device of the invention has a ferroelectric transistor, two main electrodes in the substrate and a selecting transistor electrically connected to the ferroelectric transistor, wherein a first wiring (or interconnection) to be connected to the gate electrode and a second wiring (or interconnection) to be connected, when desired, to the first and second main electrodes are incorporated into the interlayer insulation film. A semiconductor device can be implemented in this manner by using a ferroelectric transistor as a storage device. The selecting transistor is constructed with a normal MOSFET. Being constructed in this manner, a specific storage device is selected by a selecting transistor from among a plurality of storage devices. And data may be written into, flashed (or erased) from or read out of the selected storage device.

A portion of the first wiring is guided above the interlayer insulation film via a first through-hole provided in the interlayer insulation film, a portion of the second wiring is guided above the interlayer insulation film via a second through-hole provided in the interlayer insulation film and the gate unit is provided on the interlayer insulation film so that the first wiring makes contact with the gate electrode. For example, the first wiring may be a word line. The gate electrode of the ferroelectric transistor is connected to the first wiring. Also, for example, the second wiring may be a bit line. This second wiring may be, as desired, connected to either the first or second main electrode of the ferroelectric transistor and others.

In accordance with an embodiment of the present invention, an upper insulation film may be provided on the interlayer insulation film so that the upper insulation film makes contact with each of the side surfaces of the gate unit and the channel layer. The first and second main electrodes extend on the upper insulation film and are, as desired, connected to the second wiring guided from the second through-hole via a third through-hole provided in the upper insulation film. The height of this upper insulation film is preferably equal to that of the upper surface of the channel layer. However, it is sufficient that the height of this upper insulation film is at least at such a level that it makes contact with the side of the channel layer.

In accordance with a embodiment of the present invention, one of the first and second main electrodes is connected to one of the main electrode regions of the selecting transistor.

A semiconductor storage device of the invention comprises a plurality of storage elements which are the above-mentioned ferroelectric transistors, wherein data can be written into, erased or read out with respect to the predetermined one or ones of the storage elements by applying a signal to word lines and bit lines, thereby forming a non-volatile memory.

The above-mentioned ferroelectric transistor may prevent the constituting elements of the ferroelectric from being diffused in the course of a heated process, simplify the wiring process, facilitate the control of the elements and thus is suitable for obtaining a fine structure of the device. Accordingly, a semiconductor device employing this ferroelectric transistor is effective in enlarging the capacity of a storage device, making a device smaller and improving its capability.

An embodiment of the present invention comprises selecting transistors each of which is respectively assigned to each of the blocks. Each of the blocks is formed with an appropriate number of the ferroelectric transistors. In each of the blocks, the gate electrode of the ferroelectric transistor is connected to the predetermined one of the word lines, the first main electrode of the ferroelectric transistor is connected to the predetermined one of the bit lines, the second main electrode of the ferroelectric transistor is connected to the first main electrode of the selecting transistor and the second main electrode of the selecting transistor is connected to the ground.

Because of such a configuration, when the selecting transistor is in a low resistance state (referred to as an "on" state or selected state), the second main electrode of the ferroelectric transistor connected to the selecting transistor is connected to the ground. Thus, the bit line is kept in a floating status. Once a signal voltage such as a write voltage or an erase voltage is applied to a bit line, a binary data "1" or "0" can be set to each of the ferroelectric transistor.

When the selecting transistor is in a high resistance state (referred to as an "off" state or un-selected state), the second main electrode of the ferroelectric transistor connected to the selecting transistor is in a floating state. Thus even though a signal voltage is applied to a word line, the direction of the spontaneous polarization of the ferroelectric transistor does not get reversed.

Further, a read voltage is applied to a bit line by connecting the word line to the ground when the selecting transistor is in the low resistance state. Then, a current flows between the first and second main electrodes in response to the data having been written into the ferroelectric transistor. Thus, data may be read out.

As discussed above, an arbitrary block may be selected by controlling the switching state of the selecting transistor. Further, an arbitrary ferroelectric transistor belonging to the block is specified by specifying a word line, allowing data to be written into or erased from the device. Incidentally, in order to thus specify a ferroelectric transistor, the first main electrodes of all the ferroelectric transistors contained in one of the blocks are preferably connected to a single shared one of the bit lines.

In accordance with a method of operating the ferroelectric transistor on the present invention, data may be written into the ferroelectric film by opening the first main electrode and applying a write voltage across the second main electrode and the gate electrode.

Alternatively, in accordance with a method of operating the ferroelectric transistor, data may be erased from the ferroelectric film by opening the first main electrode and applying an erase voltage across the second main electrode and the gate electrode.

Further, in accordance with a method of operating the ferroelectric transistor, data may be read out of the ferroelectric film by connecting the gate electrode to the ground and applying a read voltage across the first and second main electrodes.

As seen above, data can be written into, erased from or read out of the above-mentioned ferroelectric transistor via three electrode terminals. This means that it is no longer necessary to control the substrate potential, which was required in prior art devices. Thus, the wiring process is far simplified compared to prior art devices and the device can be controlled more easily.

A method of manufacturing the ferroelectric transistor in accordance with the present invention, wherein the ferroelectric transistor comprises a gate unit having a gate electrode, a ferroelectric film and a gate insulation film deposited on an underlying structure in this order, a channel layer deposited on the gate insulation film and a first and a second main electrodes on the channel layer, includes the following:

(1) forming a first conductive layer on the underlying structure;

(2) forming a ferroelectric layer on the first conductive layer;

(3) forming a first insulation layer on the ferroelectric layer;

(4) forming a semiconductor layer on the first insulation layer;

(5) modifying the semiconductor layer to form the channel layer in a gate region;

(6) modifying the first insulation layer to form the gate insulation film;

(7) modifying the ferroelectric layer to form the ferroelectric film;

(8) modifying the first conductive layer to form the gate electrode; and (9) forming the first and second main electrodes on the channel layer.

According to this method, the first conductive layer, ferroelectric layer, first insulation layer and semiconductor layer are sequentially deposited, thereby forming a deposited structure. Thereafter, the deposited structure is also sequentially modified from top to bottom. This modification is performed by means of an ordinary etching process. In the course of this modification process, the semiconductor layer is patterned to begin with. As the result, a pattern of the semiconductor layer in the gate region is left as a channel layer. Then, in order to modify the underlying layer of the channel layer, the pattern is preferably projected onto the underlying layer. In such a manner, a gate unit which is a deposited structure having a gate electrode, a ferroelectric film and gate insulation deposited one onto another, and a channel layer are formed, thereby forming a conductive layer which will become a first main electrode and a second main electrode.

Accordingly, since a ferroelectric layer is formed prior to a semiconductor layer, the elements constituting the ferroelectric material do not diffuse in an outer direction despite a heat treatment or an annealing. Therefore, the degradation of the MOSFET's characteristic, which occurred in prior art devices, is restrained.

In accordance with this method, an interlayer insulation film is, prior to the forming of the first conductive layer, preferably deposited on a substrate to form the underlying structure.

Alternatively, the method of manufacturing a ferroelectric transistor of the present invention preferably comprises, prior to the forming of the first conductive layer, depositing an interlayer insulation film on a substrate to form the underlying structure; forming a selecting transistor on the substrate; forming the interlayer insulation film on the substrate on which a selecting transistor is formed, the interlayer insulation film having a first wiring connected to the gate electrode and a second wiring connected, as desired, to the first and second main electrode incorporated thereinto; forming a first and a second through-holes at predetermined locations in the interlayer insulation film; and embedding conductive plugs into the first and second through-holes; wherein the forming of the channel layer in the gate region includes defining the gate region as being a region over the first through-hole.

In accordance with this method, an ordinary process for forming an LSI is employed to form a selecting transistor on the substrate. Then, an interlayer insulation film is deposited onto the substrate with the selecting transistor and other desired components incorporated. In depositing the interlayer insulation film, a conductive layer such as the above-mentioned first and second wiring is also formed. Thereafter, a first and a second through-holes are formed at desired locations on the interlayer insulation film, for example, by means of the etching process. Conductive plugs are formed by embedding conductive materials into the first and second through-holes. Incidentally, the heights of the conductive plugs are preferably the same as that of the upper surface of the interlayer insulation film.

A ferroelectric transistor is formed on the thus formed interlayer insulation film by performing the above described nine actions. As pointed out above, in the forming of the channel layer in the gate region, the gate region is formed as an upper region of the first through-hole. Such a formation allows the conductive plug formed in the first through-hole to make contact with the gate electrode. That is, the first wiring makes contact with the gate electrode. This first wiring is used, for example, as a word line. Alternatively, on patterning the first conductive layer, wirings such as the first and second wirings may be insulated from one another. As such, the method of the present invention is suitable for forming an integrated circuit employing the above-mentioned transistor.

Further, the method preferably comprises, following the modifying of the first conductive layer to form the gate electrode, forming an upper insulation film on the interlayer insulation film so that the upper insulation film makes contact with the side surfaces of the gate unit and the channel layer. By forming the upper insulation film in this manner, the first and second main electrodes can be separated from the lower conductive layer. Incidentally, the height of the upper surface of each layer should be the same where the upper insulation film makes contact with the channel layer, so that the upper edge of the channel layer and the upper surface of the upper insulation film are continuous, thereby facilitating the first and second main electrodes to extend onto the upper surface of the upper insulation film. Therefore the wiring process will become easier.

The upper insulation film is preferably formed by, between the actions (8) and (9) discussed above, the forming of a second insulation layer on the interlayer insulation film so that the second insulation film covers the side and upper surfaces of the gate unit and the channel layer; and polishing the second insulation layer until the upper surface of the channel layer is exposed to form the upper insulation film.

Further, the method preferably comprises forming a third through-hole in the upper insulation film at the region containing the second through-hole. By thus forming the third through-hole, the extending portion of the first or second main electrode may be formed to be embedded into the third through-hole. Thus, the first and second main electrodes may be connected to the second wiring formed in the interlayer insulation film via the third and second through-holes.

The method of manufacturing the ferroelectric transistor of this invention preferably comprises, between the actions (3) and (4) discussed above, the eliminating of defects in the first insulation layer. For example, if the first insulation layer is made from $Ta_2O_5$, i.e., tantalum oxide, after the layer is formed, the device is preferably thermally processed in oxygen at the temperature of 500° C. Such a heat treatment will result in a reduction of the defects in tantalum oxide, thereby reducing the charge trapping density.

Alternatively the method of manufacturing a ferroelectric transistor of this invention preferably comprises forming, between the actions (1) and (2) discussed above, a second insulation layer on the first conductive layer; and modifying, between the actions (7) and (8) discussed above, the second insulation layer to form a lower conductive layer. By thus forming these layers, the second conductive layer may be used as an underlying structure on which the ferroelectric layer is formed. Therefore, the second conductive layer should be made from such a material by which the formation step (including a crystallization step) of the ferroelectric layer is performed in an optimized manner.

Alternatively the method of manufacturing a ferroelectric transistor of this invention preferably comprises forming, between the actions (2) and (3) discussed above, a third conductive layer on the ferroelectric layer; and modifying, between the actions (6) and (7) discussed above, the third conductive layer to form an upper conductive layer. By thus forming the third conductive layer (upper conductive layer), the ferroelectric layer is hardly degraded in a thermal process.

Alternatively the method of manufacturing a ferroelectric transistor of this invention preferably comprises forming, between the actions (3) and (4) discussed above, on the first insulation layer a metal oxide layer made of a material the heat of formation of the oxide of which is smaller than that of the semiconductor layer; and modifying, between the actions (5) and (6) discussed above, the metal oxide layer. By forming such a metal oxide layer, the first insulation layer is not reduced with the constituting elements of the semiconductor layer because the heat of formation of such a metal oxide layer is smaller than that of the semiconductor layer.

Further, the method preferably comprises, following the formation of the metal oxide layer, eliminating defects in the metal oxide layer so that the defects in the first insulation layer as well as those of the metal oxide layer can be reduced, thereby reducing the charge trapping densities of these layers.

The foregoing and other objects, features and advantages of the present invention will become more readily apparent from the following detailed description of a preferred embodiments which proceed with reference to the drawings.

BRIEF DESCRIPTION OF THE DRAWINGS

FIG. 14, including

FIG. 15, including

FIG. 16, including

FIG. 17, including

FIG. 18, including FIG. 19, including

DETAILED DESCRIPTION OF THE PREFERRED EMBODIMENT

Figure 1:
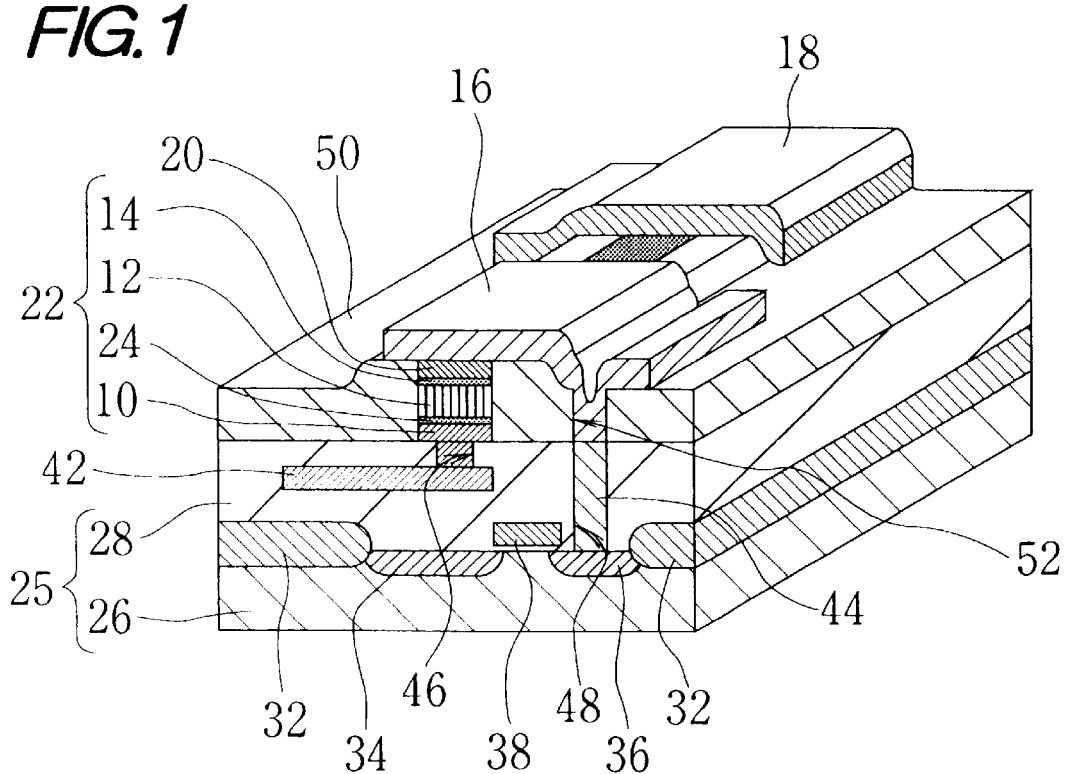
FIG. 1 is a perspective view of the first structure of a ferroelectric transistor of the present invention.

The embodiment will now be described by referring to the drawings, which are merely illustrative sufficient to make the shapes, dimensions and arrangements of the constituting elements of the invention understood. These embodiments are only exemplary and do not intend to limit the invention to themselves.

(I) Description of the Structure of the Ferroelectric Transistor

Referring to FIGS. 1–8, illustrative structures of the ferroelectric transistor will be explained. With respect to numerical conditions which are sometimes omitted in the course of the following description, please see the description of the manufacturing method to follow.

[First Embodiment of the Invention: First Structure]

Figure 2:
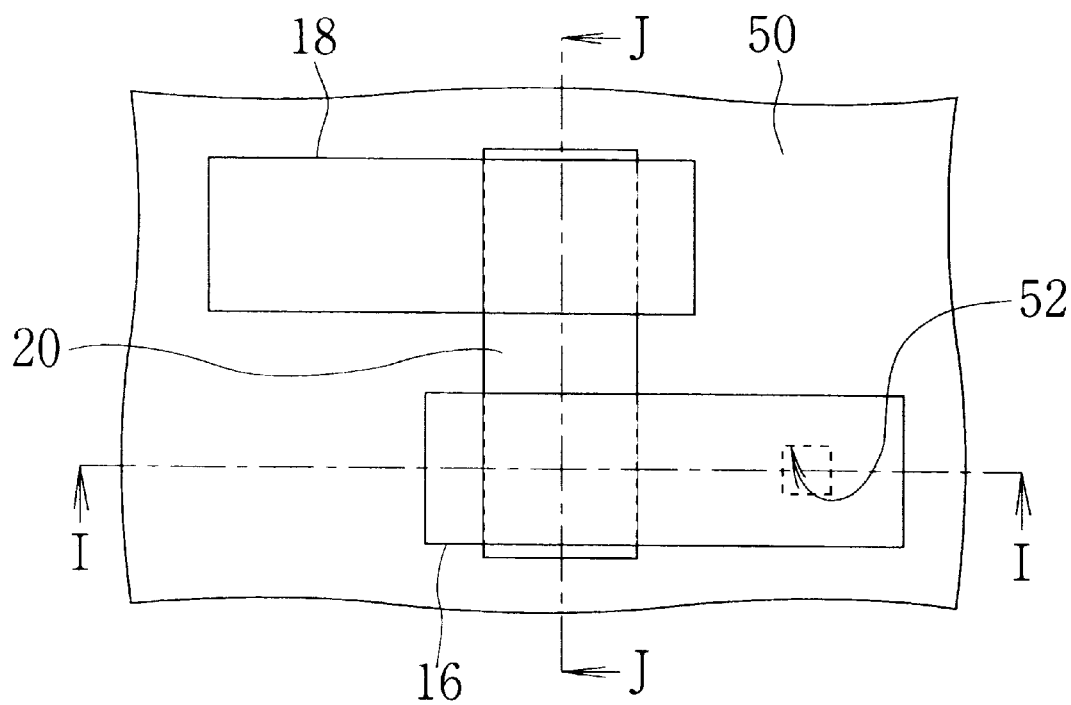
FIG. 2 is a plan view of the portion of interest of the first structure of the ferroelectric transistor.
Figure 3:
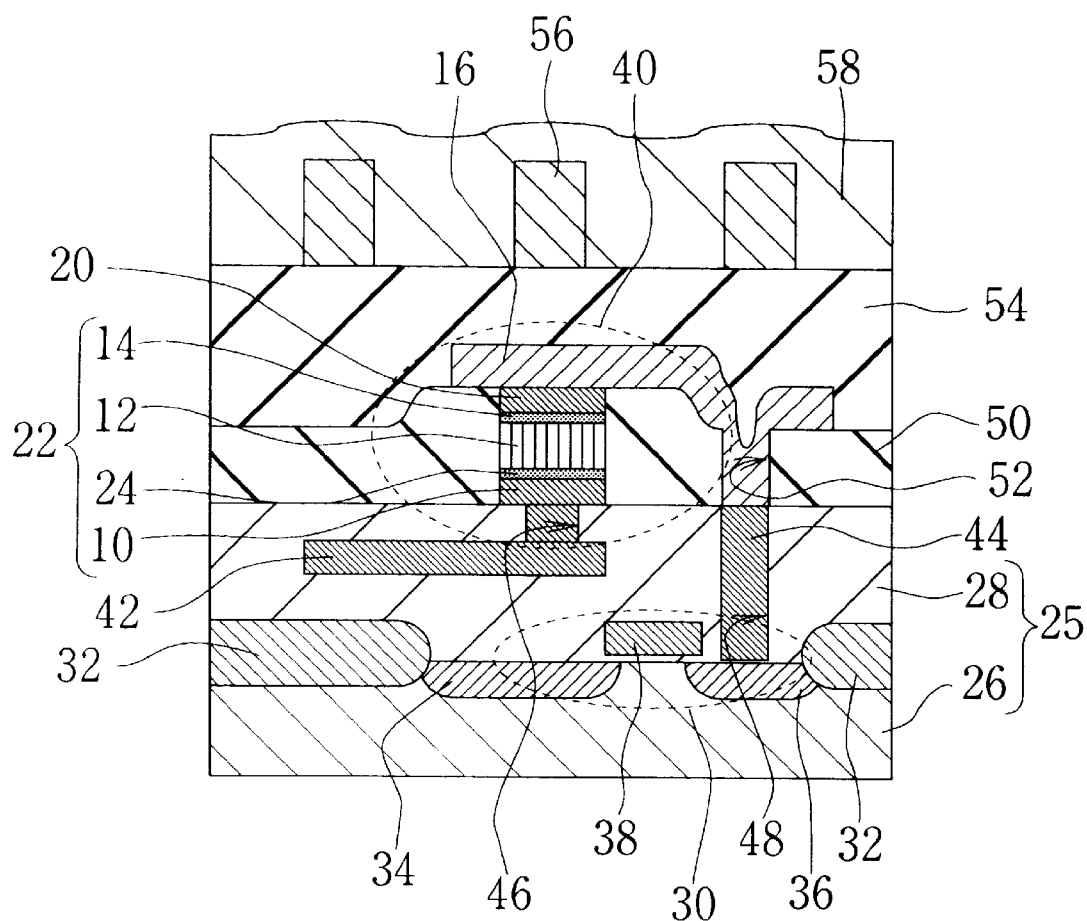
FIG. 3 is a cross sectional view of the first structure of the ferroelectric transistor.

FIG. 1 is a perspective view of interest of the first exemplary structure of the semiconductor storage device and primarily shows the first structure of the ferroelectric transistor. FIG. 2 is a plan view of interest of the first structure as seen from the side of electrodes 16 and 18. FIG. 3 is a cross sectional view as being cut along the line I—I of FIG. 2. Though interlayer insulation film 54, Al wiring 56 and surface protection film 58 are shown in FIG. 3, these are omitted in FIGS. 1 and 2.

The ferroelectric transistor of the first exemplary structure comprises at least a gate electrode 10, a ferroelectric film 12, a gate insulation film or a gate dielectric film 14, a first main electrode 16 and a second main electrode 18, and controls the carrier density of the channel by using the spontaneous polarization of the ferroelectric film 12. This ferroelectric transistor also has the gate unit 22, which includes the gate electrode 10, the ferroelectric film 12 and the gate insulation film 14 deposited in this order on an underlying structure or an underlying layer 25. Further, a channel layer 20 is provided on the gate insulation film 14. On the channel layer 20, the first and second main electrodes 16 and 18 are provided as being separated from each other. In this structure, the channel layer 20 is used as the above-mentioned channel.

Incidentally, the underlying layer 25 of this ferroelectric transistor comprises a substrate 26 and an interlayer insulation film or an interlayer dielectric layer 28 deposited in this order, and the gate electrode 10 is provided on this interlayer insulation film 28.

Also, a gate unit or a gate structure or a gate portion 22 of this ferroelectric transistor has a lower conductive layer 24 between the ferroelectric film 12 and the gate electrode 10.

The first and second main electrodes 16 and 18 are, as seen in FIG. 2, provided as covering both the upper surfaces of the channel layer 20 and an upper insulation film 50. In this embodiment, the longitudinal directions of the channel layer 20 and the first and second main electrodes 16 and 18 are set to be orthogonal. These first and second main electrodes 16 and 18 are positioned at either side of the longitudinal direction of the channel layer 20. Thanks to this configuration, the channel layer 20 between the first and second main electrodes 16 and 18 is used as being a channel in operation of the transistor.

In this embodiment, the first and second main electrodes 16 and 18 are made from polysilicon. They may also be made from amorphous silicon. It is preferable that an ohmic contact be made between the channel layer 20 and the first and second main electrodes by forming an impurities-doped region therebetween.

Further, in this embodiment, the sizes in the longitudinal and transversal directions of layers constituting gate unit 22 and the channel layer 20 are appropriately aligned. The 2 dimensional shape of each layer is rectangular. The gate unit 22 and the channel layer 20 are deposited on one another so that the cross sectional view of each of these layer as seen in FIGS. 1 and 3 is rectangular.

The structure of the ferroelectric transistor 40 (see FIG. 3) discussed above is formed on an interlayer insulation film 28 provided on the substrate 26. The substrate 26 may be made from a silicon substrate, a semiconductor substrate or other appropriate materials, as seen from a design standpoint, as long as the substrate is conductive up to a certain degree. In this embodiment, the substrate 26 is formed of silicon having the p$^-$ type conductivity (hereinafter referred to as p$^-$ type silicon). The interlayer insulation film 28 may be, for example, formed of PSG (Phospho-Silicate-Glass), BPSG (PSG containing boron) or $SiO_2$.

In this embodiment, a selecting transistor 30 is formed on the substrate 26 (dotted line portion in FIG. 3). This selecting transistor 30 comprises a source electrode region 34 and a drain electrode region 36 as main electrode regions in the upper region (active region) of the substrate 26 defined by a field oxide film 32. These source and drain electrode regions 34 and 36 are formed by doping the predetermined regions of the p– type Si substrate with impurities suitable to determine n or p conductivity type such as phosphorus (P) or boron (B). In this embodiment, these main electrode regions are an n$^+$ type Si layer. These main electrode regions are positioned on the upper side of the substrate 26 and at either side of the channel length of the selecting transistor. Further, a gate electrode 38 is formed by providing an insulation film on the channel region between these main electrodes, thereby forming the selecting transistor 30.

The interlayer film 28 is deposited on the substrate 26 on which the selecting transistor 30 is formed. Wirings or interconnections are, as desired, incorporated into this interlayer insulation film 28. In this embodiment, a first wiring 42 and a second wiring 44 are formed in the interlayer insulation film. A portion of the first wiring 42 is guided above the interlayer film 28 via a first through-hole 46 formed in interlayer insulation film 28. Then, this first wiring 42 is connected to the gate electrode 10 of the ferroelectric transistor 40. A portion of the second wiring 44 is also guided above the interlayer film 28 via the second through-hole 48 formed in the interlayer insulation film 28. Then, this second wiring 44 is connected to the first main electrode 16 of the ferroelectric transistor 40. Incidentally, in this embodiment, the first and second wirings are made from tungsten (W).

The interlayer insulation film 28, above which the first and second wirings are guided, is formed in such a manner that the film's surface is substantially planar. The above-mentioned gate unit 22 is provided on the interlayer insulation film 28 so that the gate electrode 10 of the ferroelectric transistor 40 makes contact with the first wiring 42. In this embodiment, this gate unit 22 is above the active region of the selecting transistor 30.

As seen above, in this configuration, the ferroelectric capacitor portion (ferroelectric film 12) and the MOSFET portion (gate electrode 10, gate insulation film 14 and channel layer 20) are provided on the same location on interlayer insulation film 28. Thus, this is a simple structure and suitable to reduction in size to a more microscopic level, that is, to make a fine structure of a device comprising the configuration.

Similar to the normal SOI, it is also possible for the capacitance inherent to a device, for example, the parasitic capacity of the device to be smaller, which facilitates the operation of the device at a higher speed.

The materials used to implement each of the layers of the gate unit 22 will now be explained. The channel layer 20 is made from polysilicon. Alternatively, amorphous silicon may also be used for the channel layer 20.

The gate insulation film 14 is made from $Ta_2O_5$. Other than $Ta_2O_5$, any one material selected from among $ZrO_2$, $HfO_2$, $Si_3N_4$, $CeO_2$ and $Ba_xSr_{1-x}TiO_3$ (x is a positive integer) may be used. Alternatively, the gate insulation film may be formed of any combination of more than one material arbitrarily selected from among $Ta_2O_5$, $ZrO_2$, $HfO_2$, $Si_3N_4$, $CeO_2$ and $Ba_xSr_{1-x}TiO_3$ (x is a positive integer).

The ferroelectric film 12 is made from $SrBi_2Ta_2O_9$. However, $PbZrTiO_3$, $Ba_xSr_{1-x}TiO_3$ (x is a positive integer), $Pb_5Ge_3O_{11}$, $Bi_4Ti_3O_{12}$ and $(Pb, La)TiO_3$ may also be used.

The lower conductive layer 24 is made from $IrO_2$. Other than $IrO_2$, any one material selected from among Ir, Ru, Pt, $RuO_2$, $SrRuO_3$, $La_{1-x}Sr_x CoO_3$(x is a positive integer) and $SrMoO_3$ may be used. Alternatively, the lower conductive layer may be formed of any combination of more than one material arbitrarily selected from among $IrO_2$, Ir, Ru, Pt, $RuO_2$, $SrRuO_3$ and $La_{1-x}Sr_x CoO_3$ (x is a positive integer).

The gate electrode 10 is made from tungsten (W). Other than W, the gate electrode may be formed of any one material selected from among, Ta, Mo, TiN, Nb, V, TaN, TaSiN, TiW, TiWN and TiAlN.

Other details of the structure will now be explained. In this structure, upper insulation film 50 is provided on the interlayer insulation film 28 so that the upper insulation film makes contact with the side surfaces of the gate unit 22 and the channel layer 20. The upper insulation film is made from $SiO_2$ film. The height of such a portion of this upper insulation film 50 that makes contact with a gate unit 22 may be up to an appropriate level of the channel layer 20. Preferably, however, the upper insulation film 50 should be up to the height of a neighborhood of the upper edge of channel layer 20. In this embodiment, the upper edge of the upper insulation film 50 that makes contact with the channel layer 20 is as high as the upper edge of the channel layer 20 and parallel to the upper edge of the channel layer 20. Further, such a region other than the neighborhoods of the region where the upper insulation film 50 and the channel layer 20 are contacted has a thicker film than that of the contacting region.

The first and second main electrodes 16 and 18 extend onto the upper insulation film 50. As discussed above, since the upper surface of the channel layer 20 and the upper insulation film 50 are smoothly continuous at the same level, the disconnection of the wirings at the upper edge of the channel layer 20, which may otherwise be possible, does not occur. The first main electrode 16 is connected to the second wiring 44, which is guided via a third through-hole 52, provided in this upper insulation film 50, and the second through-hole 48. The third through-hole 52 is formed in such a region of the upper insulation film 50 that includes the second through-hole 48. That is, the third through-hole 52 is situated just above the extended direction of the second through-hole 48. Then, a portion of the first main electrode 16 is embedded into the third through-hole 52. The aspect ratio of the third through-hole is suitably designed. Thus, the first main electrode 16 of the ferroelectric transistor 40 is connected to one of the main electrode regions of the selecting transistor 30, which is the drain electrode region 36 in this case.

As seen above, the upper insulation film 50 functions to separate the first and second main electrodes from lower conductive layers as well as to be a protective layer of the ferroelectric transistor 40.

Further, following the formations of the first and second main electrodes 16 and 18, an interlayer insulation film 54 is additionally formed thereupon. Then, an Al wiring 56 is formed on this interlayer insulation film 54 so as to provide a desired wiring. Materials such as PSG, BPSG and SiO2 are used to form the interlayer insulation film 54 and a surface protection layer 58.

Though any connection of the second main electrode 18 is not shown in the drawings, the electrode may be connected to a desired Al wiring 56 via a through-hole provided in the interlayer insulation film 54.

The second through fourth embodiments will now be described, where these additional embodiments are fundamentally the same as the first embodiment. Since the different features of these additional embodiments that are not shared with the first embodiment will be discussed in the following explanation, please refer to the foregoing description as to the points that will not be mentioned. In the following description, similar reference numerals will be used to refer to similar elements in the structures though the shapes and other features may be different among the embodiments.

[Second Embodiment of the Invention: Second Structure]

Figure 4:
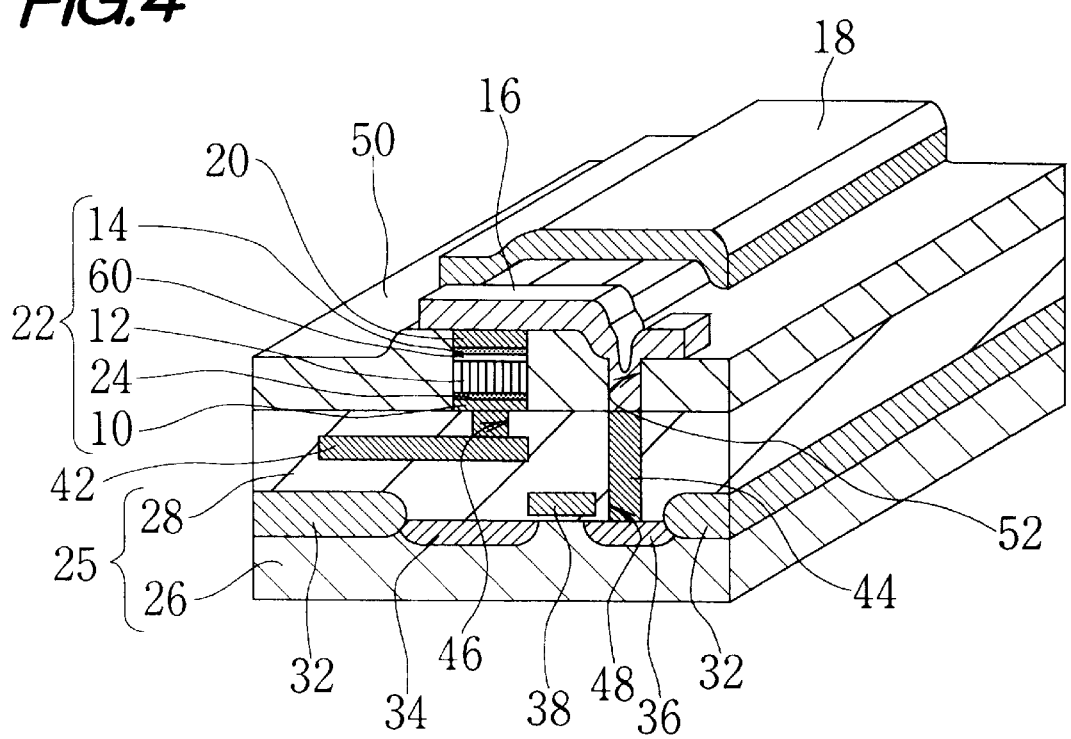
FIG. 4 is a perspective view of the second structure of the ferroelectric transistor.
Figure 5:
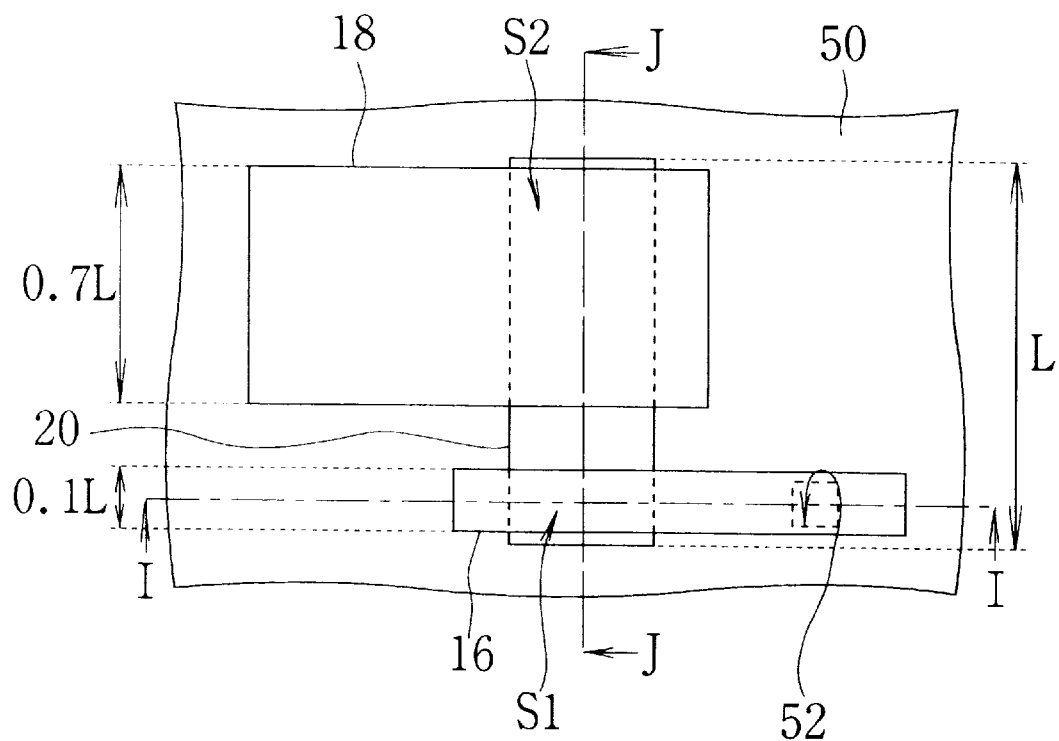
FIG. 5 is a plan view of the portion of interest of the second structure of the ferroelectric transistor.
Figure 6:
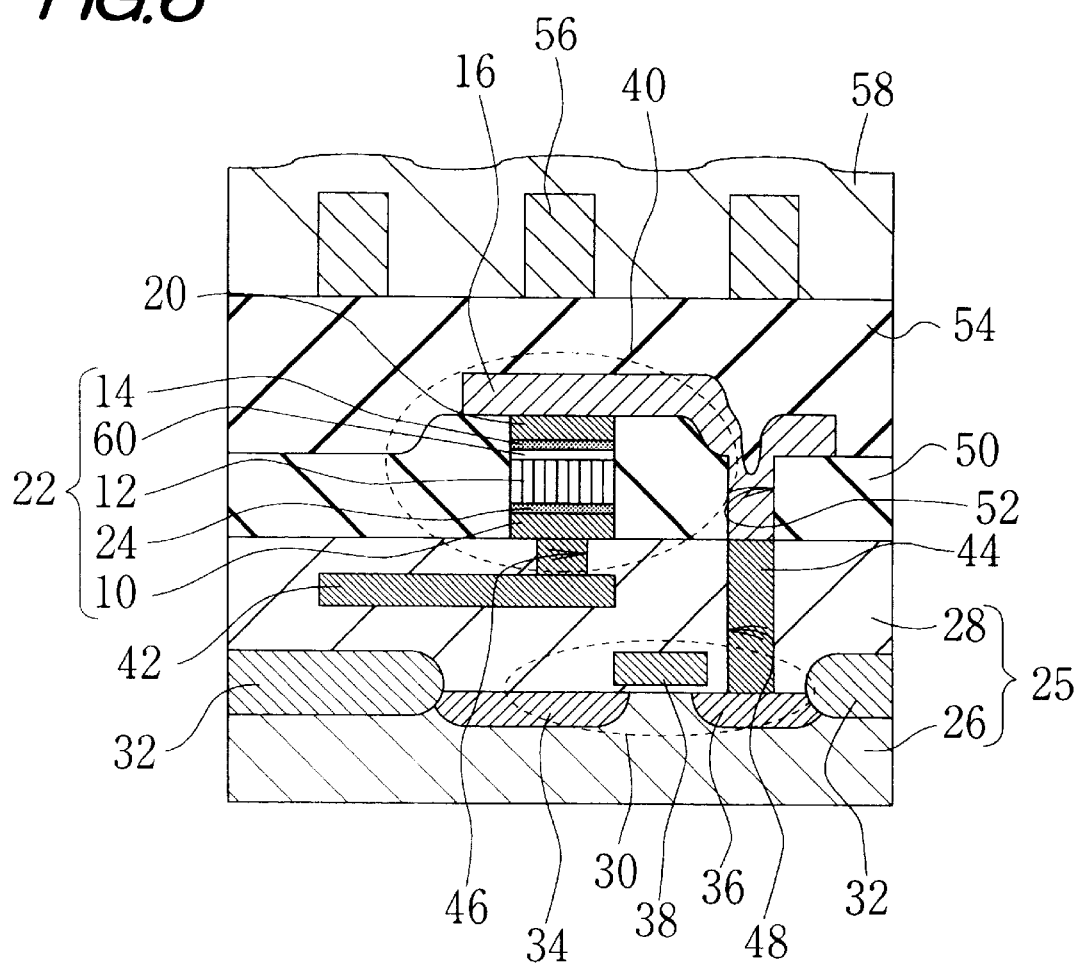
FIG. 6 is a cross sectional view of the second structure of the ferroelectric transistor.

The second structure of the ferroelectric transistor will now be explained by referring to FIGS. 4, 5 and 6. FIG. 4 is a perspective view of the second exemplary structure of the semiconductor storage device and primarily shows the second structure of the ferroelectric transistor. FIG. 5 is a plan view of the portion of interest of the second structure as seen from the direction where electrodes 16 and 18 are situated. FIG. 6 is a cross sectional view of FIG. 5 as being cut along line I—I. Though the interlayer insulation film 54, Al wiring and a surface protection layer 58 are shown in FIG. 6, these are omitted in FIGS. 4 and 5 for the sake of simplicity.

The structure shown in this second embodiment is different from the first structure in that the upper conductive layer 60 is provided between the gate insulation film 14 and the ferroelectric film 12. In this embodiment, the upper conductive layer 60 is made from $IrO_2$. Other than $IrO_2$, any one material selected from among Ir, Ru, Pt, $RuO_2$, $SrRuO_3$, $La_{1-x}Sr_x CoO_3$(X is a positive integer) and $SrMoO_3$ may be used. Alternatively, the upper conductive layer may be formed of any combination of more than one material arbitrarily selected from among $IrO_2$, Ir, Ru, Pt, $RuO_2$, $SrRuO_3$, $La_{1-x}Sr_x CoO_3$ (x is a positive integer) and $SrMoO_3$. In this exemplary structure, the longitudinal direction and transversal size of the channel of the upper conductive layer 60 is the same as those of other layers constituting the gate unit 22.

In this structure, the area (S1 of FIG. 5) of the portion where the first main electrode 16 makes contact with the channel layer 20 is different from the area (S2 of FIG. 5) of the portion where the second main electrode 18 makes contact with the channel layer 20. As seen in FIG. 5, if the length of the channel layer 20 in the longitudinal direction to the channel is set to be L, then the length of the first main electrode 16 in the longitudinal direction to the channel will be 0.1L and the length of the second main electrode 18 in the longitudinal direction to the channel will be 0.7L. Thus, in this structure, the ratio of S1 and S2, that is S1:S2, is 1:7.

[Third Embodiment of the Invention: Third Structure]

Figure 7:
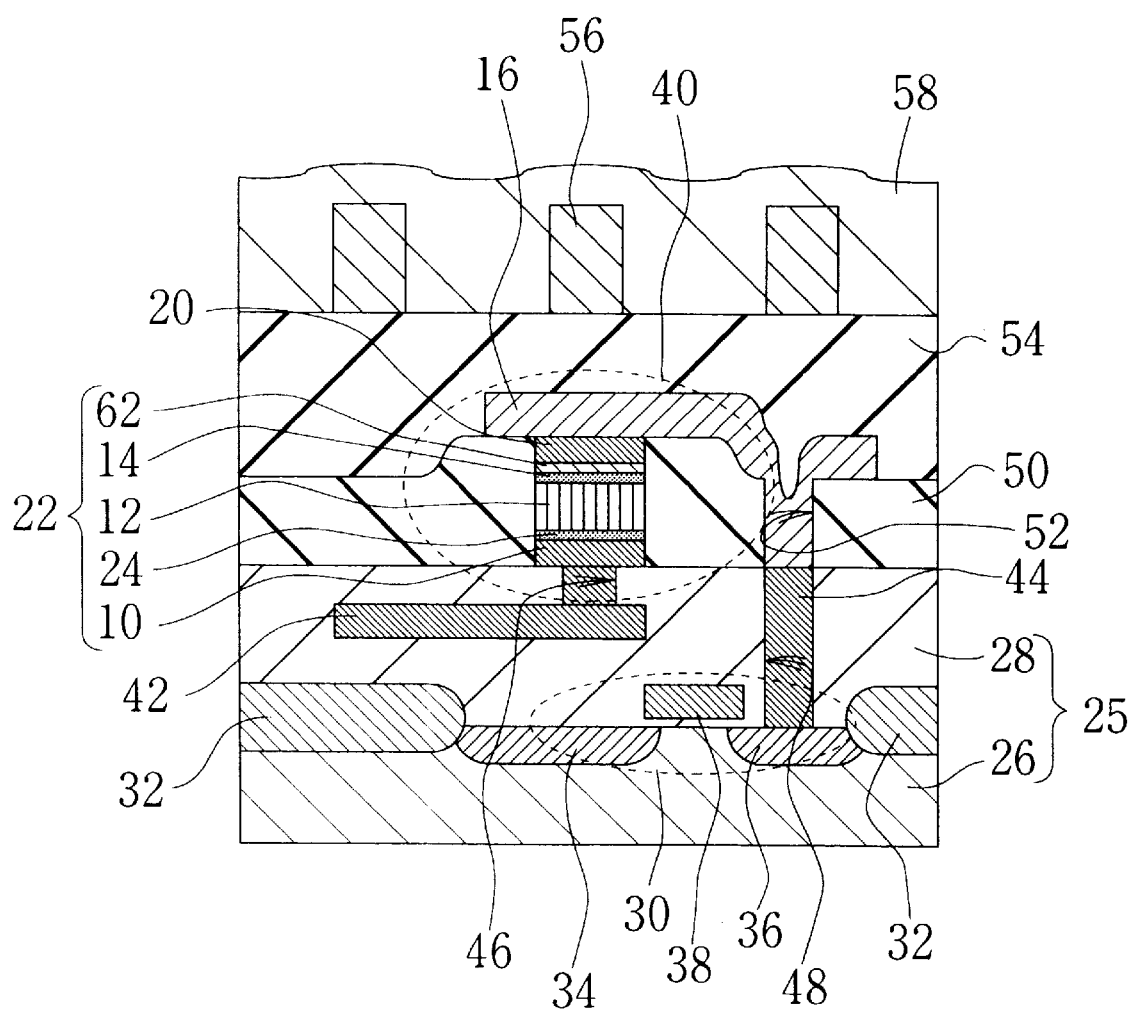
FIG. 7 is a cross sectional view of the third structure of the ferroelectric transistor.

The third exemplary structure of the ferroelectric transistor will now be described by referring to FIG. 7, which shows a cross sectional view of the transistor as being cut along line I—I of FIG. 2.

This structure is different from that of the first embodiment in that the gate unit 22 has a metal oxide layer 62 between the channel layer 20 and the gate insulation film 14, and the channel layer 20 is formed on the metal oxide layer 62. The metal oxide layer 62 is formed of a material the heat of formation of the oxide of which is smaller than that of the channel layer 20. In this exemplary structure, the metal oxide layer 62 is formed of $ZrO_2$. However, other than $ZrO_2$, it may be formed of any one material selected from among $TiO_2$, $HfO_2$ and $Al_2O_3$. Alternatively, the metal oxide 62 may be formed of any combination of more than one material arbitrarily selected from among $ZrO_2$, $TiO_2$, $HfO_2$ and $Al_2O_3$.

At this point, exemplary figures of the heat of formation of each material will be given. The heat of formation of Si which constitutes the channel layer 20 is $-170$ kcal/g.mol$O_2$ at the temperature of 600° C. And the heat of formation of $ZrO_2$ is $-220$ kcal/g.mol$O_2$ at the temperature of 600° C. Further, the heat of formation of $TiO_2$ is $-190$ kcal/g.mol$O_2$ at the temperature of 600° C. The heat of formation of $HfO_2$ is $-230$ kcal/g.mol$O_2$ at the temperature of 600° C. and the heat of formation of $Al_2O_3$ is $-220$ kcal/g.mol$O_2$ at the temperature of 600° C.

Incidentally, in this exemplary structure, the longitudinal direction and transversal size of the channel of the metal oxide 62 is the same as those of other layers constituting the gate unit 22.

[Fourth Embodiment of the Invention: Fourth Structure]

Figure 8:
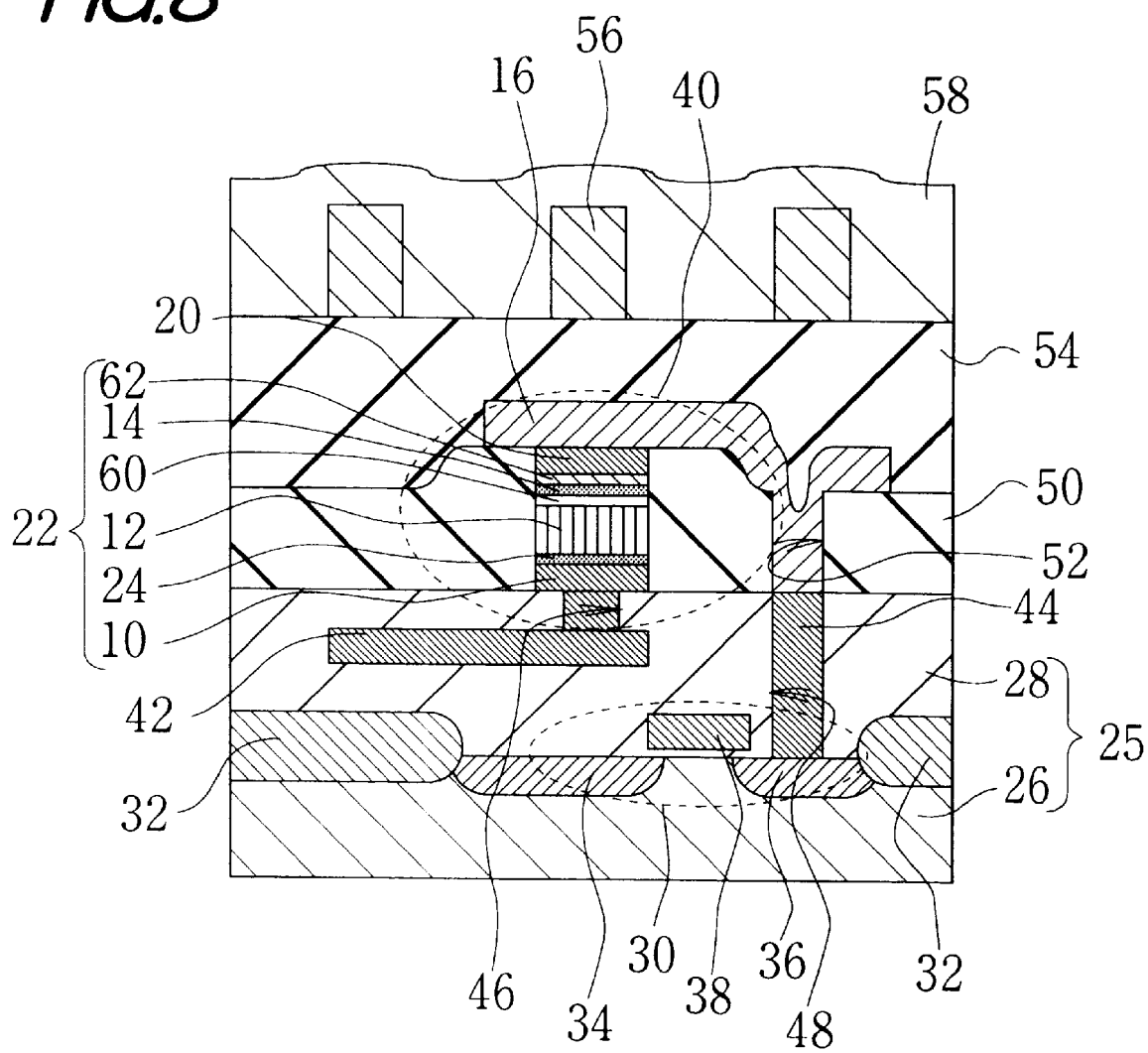
FIG. 8 is a cross sectional view of the fourth structure of the ferroelectric transistor.

The fourth exemplary structure of the ferroelectric transistor will now be described by referring to FIG. 8, which shows a cross sectional view of the transistor as being cut along line I—I of FIG. 5.

The characterizing feature of this fourth exemplary structure is that the gate unit 22 has the upper conductive layer 60 between the gate insulation film 14 and the ferroelectric film 12, which is similar to the case of the second embodiment, and that the gate unit 22 has the metal oxide layer 62 between the channel layer 20 and the gate insulation film 14, which is similar to the case of the third embodiment. Further, as in the case of the third embodiment, the metal oxide layer 62 is formed of a material the heat of formation of the oxide of which is smaller than that of the channel layer 20.

The size or material of the upper conductive layer 60 may be the same as in the case of the second embodiment. Also the size or material of the metal oxide layer 62 may be the same as in the case of the third embodiment.

The ferroelectric transistor of the present invention is not limited to the above-mentioned first to fourth exemplary structure. For example, the first and second main electrodes 16 and 18 may be formed in the channel layer 20 by doping the layer with impurities. Alternatively, the first main electrode 16 may not be connected to the main electrode region of the selecting transistor but may be connected to the Al wiring 56 on the upper side.

[An Embodiment of a Semiconductor Storage Device]

The semiconductor storage device which is the ferroelectric transistor in the above first to fourth structure used as a storage device will now be described by referring to FIGS. 9 to 13. To begin with, the characteristics and operation of the ferroelectric transistor will be explained.

<The Characteristics of the Ferroelectric Film>

Figure 9:
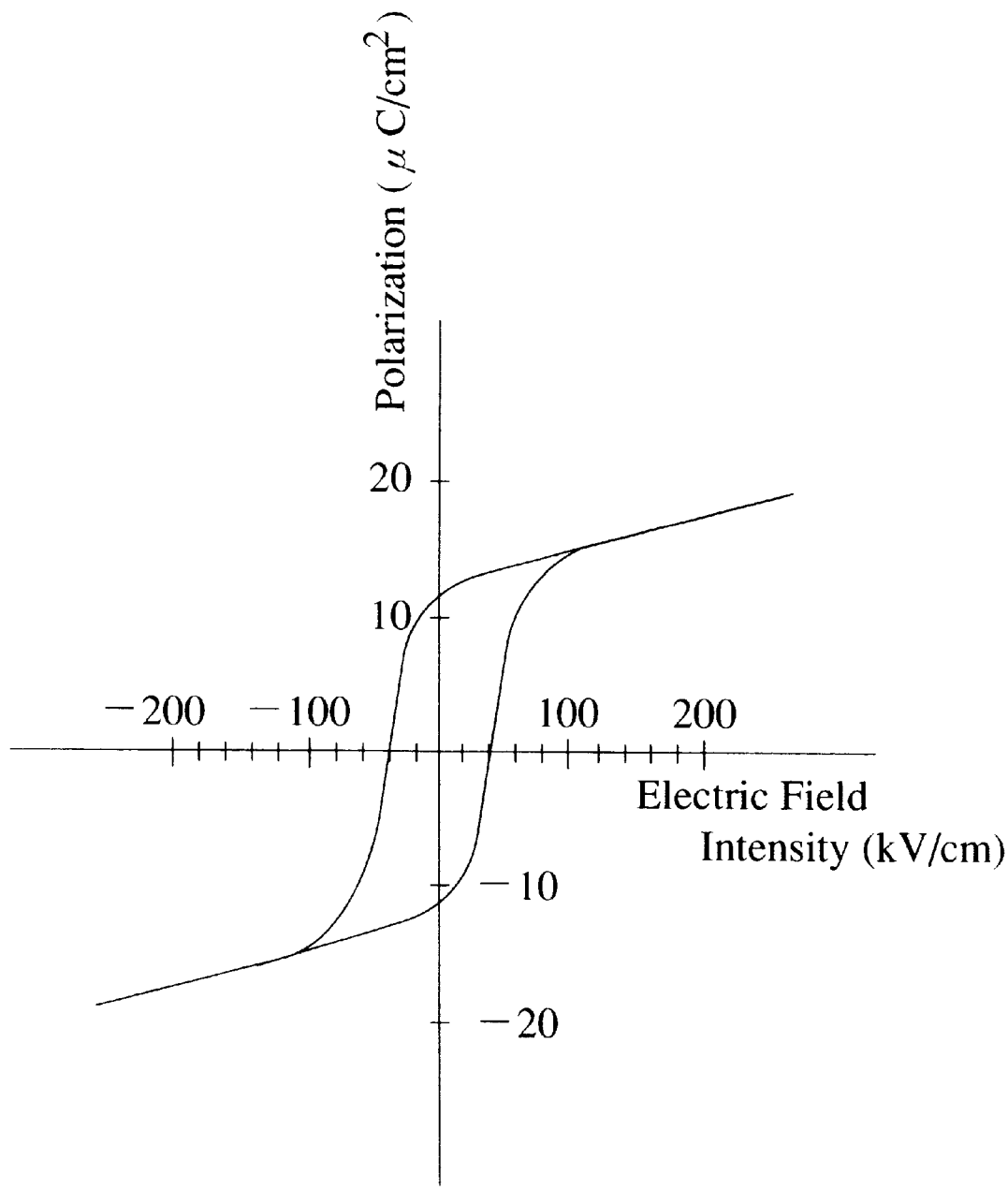
FIG. 9 is a diagram showing the hysteresis characteristics of $SrBi_2Ta_2O_9$.

FIG. 9 is a graph showing the hysteresis characteristics of the ferroelectric film 12 used in the above first to fourth structure. In these exemplary structures, as already described, $SrBi_2Ta_2O_9$ is used as the ferroelectric film 12. The horizontal axis of FIG. 9 represents the electric field intensity (strength) applied to the ferroelectric film in the unit of (kV/cm) and every 20 (kV/cm) is dotted from $-200$ (kV/cm) to 200 (kV/cm). The vertical axis of FIG. 9 represents the polarization formed on the ferroelectric film in the unit of ($\mu C/cm^2$) and every 10 ($\mu C/cm^2$) is dotted from $-20$ ($\mu C/cm^2$) to 20 ($\mu C/cm^2$). The measurement is performed by using an apparatus named RT6000S commercially available from Radiant Technology Corporation of the United States.

From the measurement shown in FIG. 9, the following characteristics of the ferroelectric film 12 are obtained: the corrective electric field is 40 (kV/cm), the residual polarization is 12 ($\mu C/cm^2$) and relative dielectric constant is 200. The ferroelectric film 12 is 0.4 $\mu$m thick.

In this embodiment, $Ta_2O_5$ is used as the gate insulation film 14. The relative dielectric constant of $Ta_2O_5$ is 25 and the film is 0.05 $\mu$m thick.

<The Operation of the First Structure>

The operation of the first exemplary structure will now be explained. FIG. 10, which shows a cross sectional view of the gate unit 22 as being cut along line J—J of FIG. 2, will be referred to in explaining the operation of the first exemplary structure. In FIG. 10, the plus notation "+" means such a situation that the positive charges are induced at the surface of the ferroelectric film 12 while the minus notation "−" means such a situation that the negative charges are induced at the surface of the ferroelectric film 12. Also, the figure shows how the electrodes are electrically connected.

In this exemplary structure, the direction of the spontaneous polarization is controlled only in the region of the ferroelectric film 12 which is sandwiched between the second main electrode 18 and the gate electrode 10, that is, the region onto which the second main electrode is projected toward the depositing direction of the gate unit 22. Thus, the carrier density control of the channel layer 20 is done by the non-vertical direction (non-depositing direction) of the spontaneous polarization.

Let the electric capacitance of the region of the ferroelectric film 12 sandwiched between the second main electrode 18 and the gate electrode 10 be represented by Cs. And let the electric capacitance of the region of the gate insulation film 14 sandwiched between the second main electrode 18 and the gate electrode 10 be represented by Chs. In this exemplary structure, the electrode areas (capacitor areas) of capacitors Cs and Chs are identical to each other.

Figure 10A:
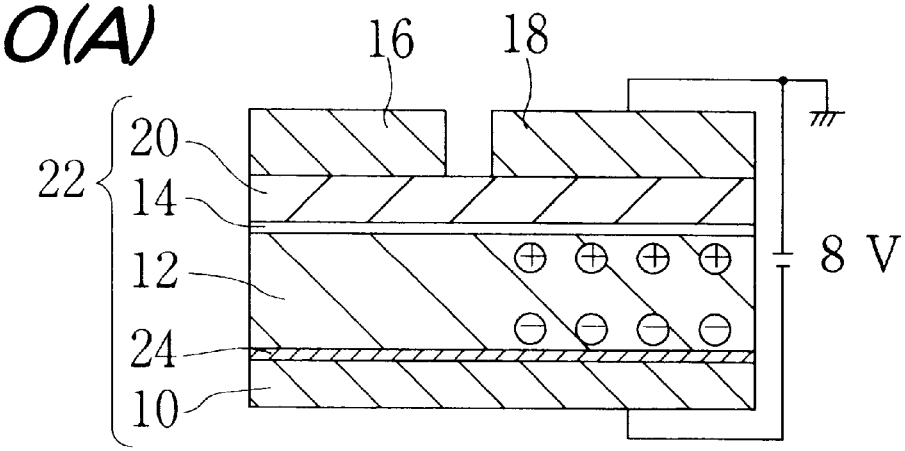
FIG. 10, including FIGS. 10(A)–10(C), explains the operation of the first structure.

FIG. 10(A) shows such a situation that the logical value "1" of the binary data is written into the ferroelectric film 12. In this exemplary structure, data may be written into the ferroelectric film 12 by leaving the first main electrode 16 open and applying the write voltage of 8 V (volt) across the second main electrode 18 and the gate electrode 10. That is, the voltage of 0 V is applied to the second main electrode 18 while the voltage of −8 V is applied to the gate electrode 10.

In this instance, the voltage Vg (the unit is in V) applied to the ferroelectric film 12 may be written as in the following equation (1):

$$Vg = -8 \times Chs/(Cs+Chs) = -8/(1+Cs/Chs) \qquad (1)$$

In this embodiment, if the above-mentioned film thickness and relative dielectric constant are used, then Cs/Chs= (200/0.4)/(25/0.05)=1. Thus, Vg=−4 (V) is obtained from the equation (1). That is, the electric field intensity applied to the ferroelectric film 12 will be −100 (kV/cm). Thus, as apparent form the hysteresis characteristics shown in FIG. 9, it is well possible to reverse the polarization of the ferroelectric film 12.

Figure 10B:
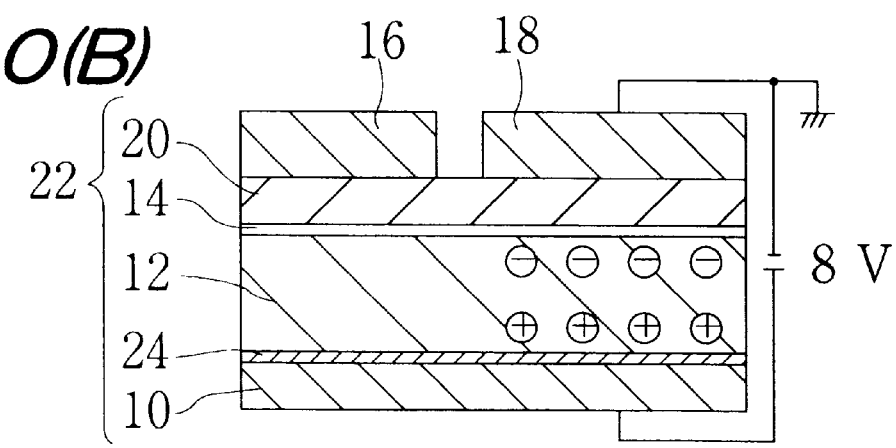

FIG. 10(B) shows such a situation that the logical value "0" of the binary data is written into the ferroelectric film 12. That is, the figure shows such a situation that the data "1" stored in the ferroelectric film 12 is flashed. In this exemplary structure, data may be erased from the ferroelectric film 12 by leaving the first main electrode 16 open and applying an erase voltage of −8 V (volt) across the second main electrode 18 and the gate electrode 10. That is, the voltage of 0 V is applied to the second main electrode 18 while the voltage of 8 V is applied to the gate electrode 10.

In this instance, the voltage Vg (the unit is volt=V) applied to the ferroelectric film 12 may be written as in the following equation (2):

$$Vg=8\times Chs/(Cs+Chs)=8/(1+Cs/Chs) \qquad (2)$$

Thus, since Cs/Chs=1 as in the case of writing, Vg=4 (V) is obtained from the equation (2). That is, the electric field intensity applied to the ferroelectric film 12 when data is flashed is 100 (kV/cm). Thus, as apparent form the hysteresis characteristics shown in FIG. 9, it is well possible to reverse the polarization of the ferroelectric film 12.

Figure 10C:
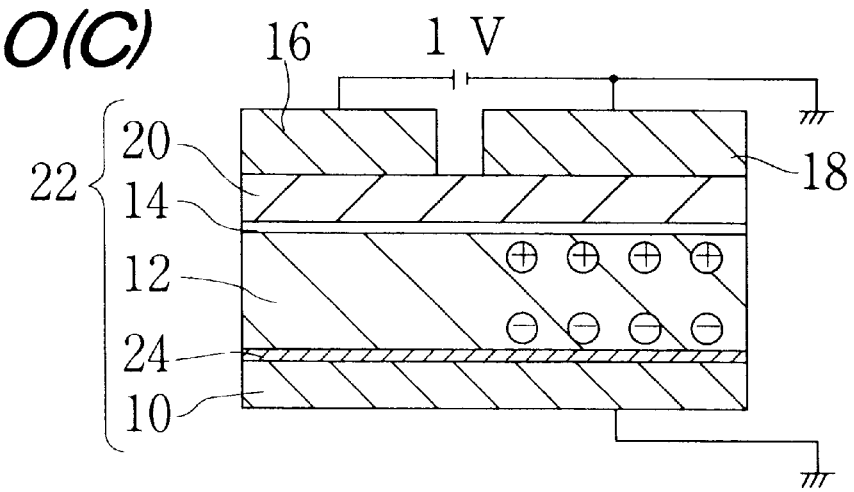

FIG. 10(C) shows such a situation that the data stored in the ferroelectric film 12 is read out. In this exemplary structure, the data may be read out of the ferroelectric film 12 by connecting the gate electrode 10 to the ground and applying read voltage of 1 V across the first main electrode 16 and the second main electrode 18. That is, the voltage of 0 V is applied to each of the gate electrode 10 and the second main electrodes 18 while the voltage of 1 V is applied to the first main electrode 16.

Figure 11:
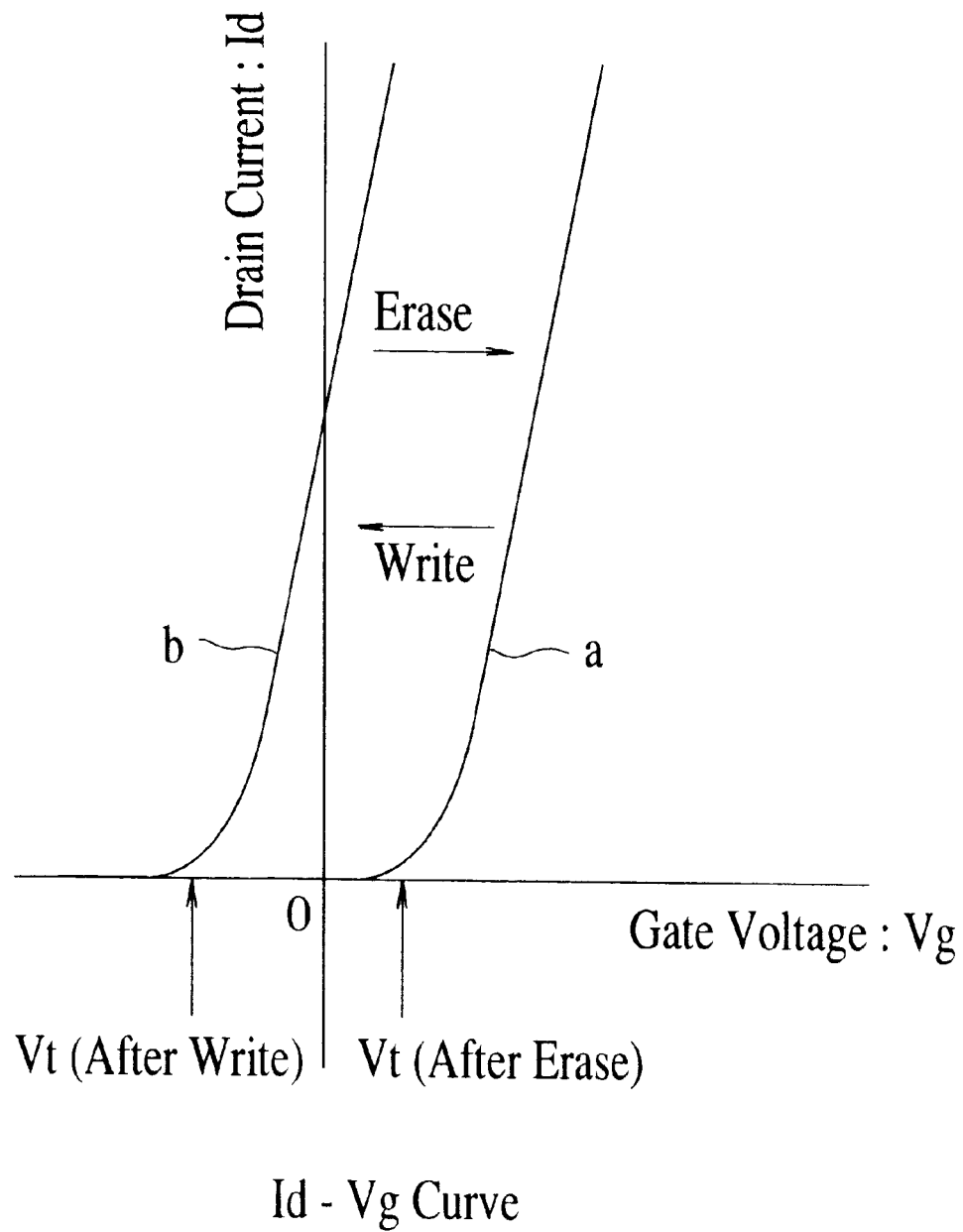
FIG. 11 shows the relationship between Id and Vg.

Data may be read out by detecting the drain current Id flowing between the first and second main electrodes 16 and 18 via the channel layer 20. FIG. 11 is a graph showing the relationship between the drain current Id and the gate voltage Vg applied to the gate electrode 10. In FIG. 11, the horizontal axis represents a gate voltage Vg while the vertical axis represents a drain current Id. The units are arbitrary on both axes. On the same graph, the Id-Vg curve a, which represents reading out the data "1", and the Id-Vg curve b which represents reading out the data "0", are shown so that the two curves can be X compared.

Firstly, when the data "1" is kept in the ferroelectric transistor as the result of the write operation mentioned above, the threshold voltage Vt is smaller than 0 V. Thus, the operational condition is normally "on", so that drain current Id flows even if the gate voltage Vg is equal to 0 V.

When the data "0" is kept in the ferroelectric transistor as the result of the erase operation mentioned above, the threshold voltage Vt is greater than 0 V. Thus, the drain current Id does not flow if the gate voltage Vg is equal to 0 V.

In this manner, the data value kept in the ferroelectric transistor can be determined by detecting the value of drain current Id.

In the above-mentioned third structure, the metal oxide layer 62 is provided between the gate insulation layer 14 and the channel layer 20. However, by regarding the gate insulation layer 14 of this structure as being dual-layered, or by appropriately setting the layer thickness, such a structure will not effect the operation. Thus, the third structure can be treated as the same as the first structure with respect to its operation.

<The Operation of the Second Structure>

The operation of the second exemplary structure will now be explained. FIG. 12, which shows a cross sectional view of the gate unit 22 as being cut along line J—J of FIG. 5, will be referred to in explaining the operation of the second exemplary structure. In FIG. 12, the plus notation "+" means such a situation that the positive charges are induced at the surface of the ferroelectric film 12 while the minus notation "−" means such a situation that the negative charges are induced at the surface of the ferroelectric film 12. Also, the figure shows how the electrodes are electrically connected.

In this exemplary structure, the upper conductive layer 60 is inserted between the gate insulation film 14 and the ferroelectric film 12. Thus, as opposed to the case with the first structure, the spontaneous polarization in all areas of the ferroelectric film 12 can be controlled. Thus, the carrier density control of the channel layer 20 is done by the vertical component (that is the depositing direction) of the spontaneous polarization.

Also, as already discussed above, in this exemplary structure, the area S1 of the region where the first main electrode 16 makes contact with the channel layer 20 and the area S2 of the region where the second main electrode 18 makes contact with the channel layer 20 is so designed that the ratio S1:S2=1:7.

Let the electric capacitance of the ferroelectric film 12 be represented by Cf. And let the electric capacitance of the region of the gate insulation film 14 sandwiched between the second main electrode 18 and the gate electrode 10 be represented by Ch. In this exemplary structure, the ratio of the electrode areas (capacitor areas) of the capacitors Cf and Ch is 10:7. Let this ratio be represented by η(=10/7).

Figure 12A:
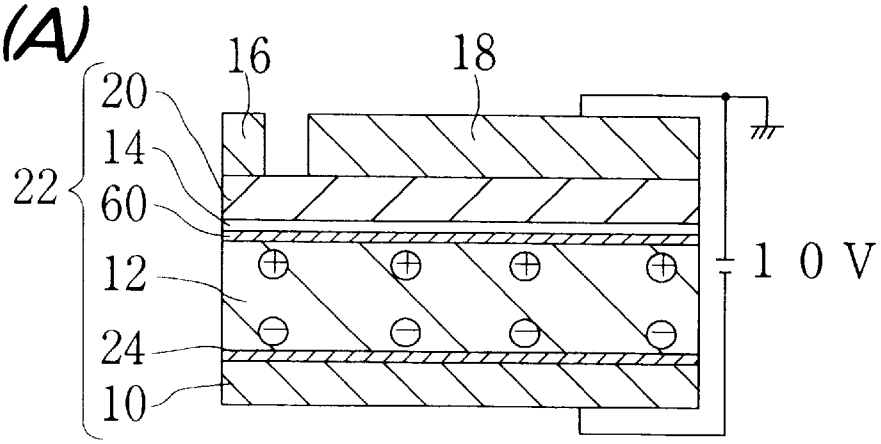
FIG. 12, including FIGS. 12(A)–12(C), explains the operation of the second structure.

FIG. 12(A) shows such a situation that the logical value "1" of the binary data is written into the ferroelectric film 12. In this exemplary structure, data may be written into the ferroelectric film 12 by leaving the first main electrode 16 open and applying the write voltage of 10 V (volt) across the second main electrode 18 and the gate electrode 10. That is, the voltage of 0 V is applied to the second main electrode 18 while the voltage of −10 V is applied to the gate electrode 10.

In this instance, the voltage Vg (the unit is in V) applied to the ferroelectric film 12 may be written as in the following equation (3):

$$Vg=-10\times Ch/(Cf+Ch)=-10/(1+Cf/Ch) \qquad (3)$$

In this embodiment, if the above-mentioned film thickness and relative dielectric constant are used, then Cf/Ch= η×(200/0.4)/(25/0.05)=1.43. Thus, Vg=−4.1 (V) is obtained from equation (3). That is, the electric field intensity applied to the ferroelectric film 12 will be −103 (kV/cm). Thus, as apparent from the hysteresis characteristics shown in FIG. 9, it is well possible to reverse the polarization of the ferroelectric film 12.

Also, this exemplary structure has an advantage that a voltage Vg, which is a voltage applied to the ferroelectric film 12 when data is being written, can be appropriately set by the ratio η between the capacitor areas.

Figure 12B:
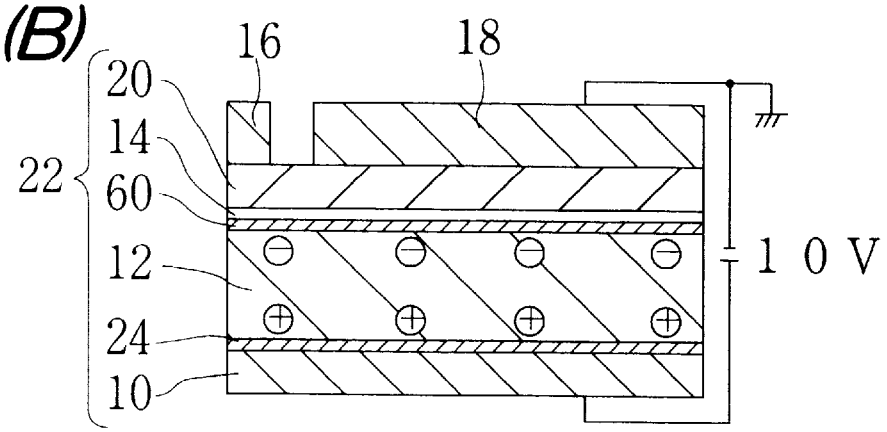

FIG. 12(B) shows such a situation that the logical value "0" of the binary data is written into the ferroelectric film 12. That is, the figure shows such a situation that the data "1" stored in the ferroelectric film 12 is flashed. In this exemplary structure, data may be erased from the ferroelectric film 12 by leaving the first main electrode 16 open and applying an erase voltage of −10 V (volt) across second main electrode 18 and the gate electrode 10. That is, the voltage of 0 V is applied to the second main electrode 18 while the voltage of 10 V is applied to the gate electrode 10.

In this instance, the voltage Vg (the unit is in V) applied to the ferroelectric film 12 may be written as in the following equation (4):

$$Vg=10\times Ch/(Cf+Ch)=10/(1+Cf/Ch) \qquad (4)$$

Thus, since Cf/Ch=η=1.43 as in the case of writing, Vg=4.1 (V) is obtained from the equation (4). That is, the electric field intensity applied to the ferroelectric film 12 when data is flashed is 103 (kV/cm). Thus, as apparent from the hysteresis characteristics shown in FIG. 9, it is well possible to reverse the polarization of the ferroelectric film 12.

In this manner, in this exemplary structure, a voltage Vg, which is a voltage applied to the ferroelectric film 12 when data is being erased, can be appropriately set by the ratio η between the capacitor areas.

Figure 12C:
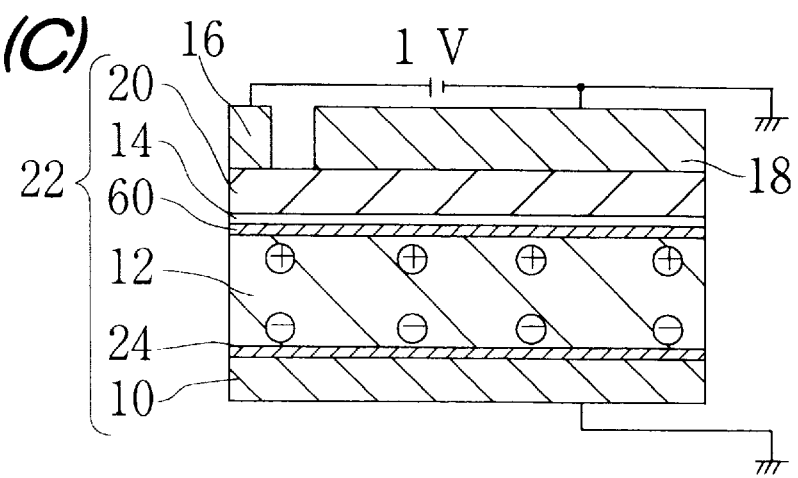

Further, FIG. 12(C) shows such a situation that the data stored in the ferroelectric film 12 is read out. In this exemplary structure, the data may be read out of the ferroelectric film 12 by connecting the gate electrode 10 to the ground and applying a read voltage of 1 V across the first main electrode 16 and the second main electrode 18. Therefore, since read operation in this exemplary structure can be performed as in the case of the first structure, further explanation will be omitted.

In the above-mentioned fourth structure, the metal oxide layer 62 is provided between the gate insulation layer 14 and the channel layer 20. However, by regarding the gate insulation layer 14 of this structure as being dual-layered, or by appropriately setting the layer thickness, such a structure will not effect the operation. Thus, the fourth structure can be treated as the same as the second structure with respect to its operation.

<The Configuration and Operation of the Semiconductor Storage Device>

A semiconductor storage device will now be explained which employs the ferroelectric transistors of the above-mentioned first to fourth structure as storage devices. As seen above, all the ferroelectric transistors of the above-mentioned first to fourth structure can be operated basically in the same manner. Thus, the semiconductor discussed below may be implemented with either one of the first to fourth structure.

Figure 13:
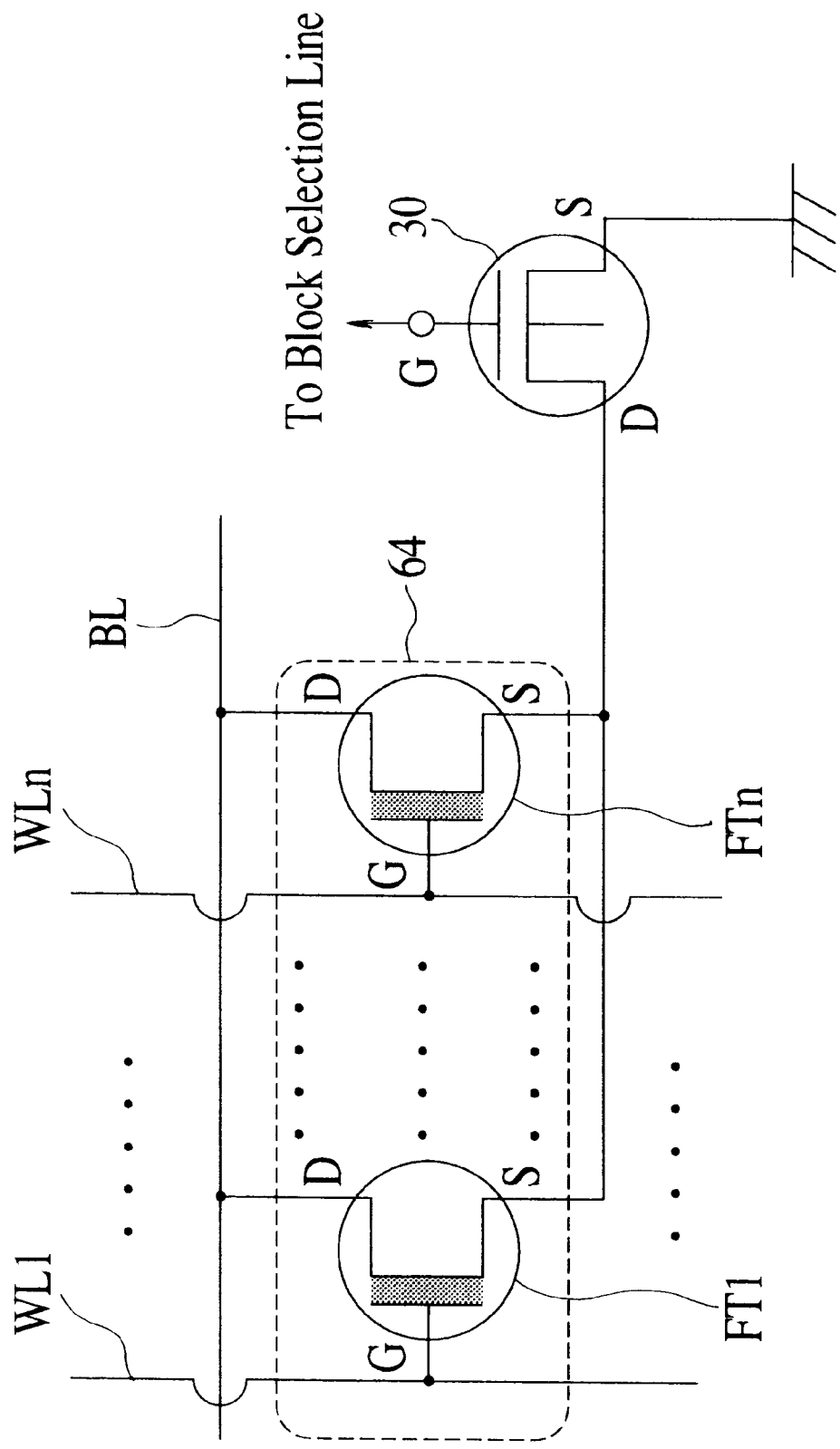
FIG. 13 is a diagram for explaining a structure of a semiconductor storage device of the present invention.

FIG. 13 is a schematic diagram showing a portion of interest of the semiconductor storage device of this exemplary structure. This semiconductor storage device, having a plurality of storage elements, is a non-volatile memory which data may be written into, erased from or read out of by applying a signal to the word and bit lines thereof. This device has either of the above-mentioned first to fourth ferroelectric transistors.

In this exemplary structure, one block is formed of an appropriate number of ferroelectric transistors and is provided with the selecting transistor 30 assigned thereto. In other words, the foregoing description of the first to fourth structure in reference to FIGS. 1–8 were directed to such a region that includes this selecting transistor 30. In FIG. 13, one block 64 is illustrated out of a plurality of blocks. The block 64 comprises, as in other blocks, n storage devices, that is, ferroelectric transistors FT1–FTn (n is a natural number). However, only the first ferroelectric transistor FT1 and the n-th ferroelectric transistor FTn are shown and the remaining ones are omitted for the sake of simplicity. Thus, in each block, n bits of data may be processed.

The connection relationship around block 64 will now be explained. This exemplary structure comprises word lines WL1–WLn, the number of which is equal to the number of the storage devices, and a bit line BL. The gate electrode of the ferroelectric transistor is connected to the predetermined word line. In the exemplary structure shown in FIG. 13, a gate electrode G of ferroelectric transistor FT1 is connected to the word line WL1 while the gate electrode G of the ferroelectric transistor FTn is connected to the word line WLn.

Further, the first main electrode of each of the ferroelectric transistors is connected to the predetermined bit line. In the exemplary structure shown in FIG. 13, the first main electrodes of the ferroelectric transistors FT1 and FTn, that is, the drain electrodes D thereof are connected to the bit line BL. Thus, in this exemplary structure, the first main electrodes or drain electrodes of all the ferroelectric transistors included in one block are connected to one common bit line. This means that in this exemplary structure write and flash operations may be simultaneously performed with respect to n bits of the ferroelectric transistors.

The second main electrode of each of the ferroelectric transistors is connected to the first main electrode of the selecting transistor 30 associated or with allotted to each block. In the exemplary structure shown in FIG. 13, the second main electrodes of the ferroelectric transistors FT1 and FTn, that is, the source electrodes S thereof are connected to the first main electrode or the drain electrode D of the selecting transistor 30 associated with the block.

Additionally, the second main electrode or the source electrode S of the selecting transistor 30 is connected to the ground. A block selection line is connected to the gate electrode G of the selecting transistor 30 but is not shown for the sake of simplicity.

As seen above, since each storage device has three terminals, the device may be controlled via three kind of signal lines, that is, a word line, a bit line and a block selection line. The operating method of the semiconductor device will now be explained.

To begin with, the selecting transistor 30 for the controlling block 64 into which a write operation is intended is turned on by applying a signal via the block selection line. As the result, the source electrodes S of the ferroelectric transistors FT1 through FTn included in this block 64 become connected to the ground. Then, by applying a write voltage to a desired word line WL1–WLn, data "1" will be written into the ferroelectric transistor connected to the word line. In the case of this write operation, the bit line BL is kept in the floating status.

With respect to the blocks that are not selected, the selecting transistors for controlling these un-selected blocks are kept in an "off" status. Thus, the source electrodes of the ferroelectric transistors included in these un-selected blocks are in the floating status. Since the bit line BL is floating, the drain electrodes of the ferroelectric transistors included in these un-selected blocks are also in the floating status. Accordingly, even if a write voltage is applied to the gate electrodes of these ferroelectric transistors, the spontaneous polarization of the ferroelectric transistors does not get reversed.

In order to perform an erase operation, selecting transistor 30 for controlling block 64 into which the erase operation is intended is turned on by applying a signal to the block selection line. Thus, the source electrodes S of the ferroelectric transistors FT1 through FTn included in this block 64 become connected to the ground. Then, by applying an erase voltage to a desired word line WL1–WLn, data "0" will be written into the desired ferroelectric transistor. In the case of this erase operation, the bit line BL is kept in the floating status.

In the case of this erase operation as well as in the case of the above-mentioned write operation, both the source and drain electrodes of the ferroelectric transistors included in the un-selected blocks are in the floating status. Accordingly, even if an erase voltage is applied to the gate electrodes of these ferroelectric transistors, the spontaneous polarization of the ferroelectric transistors does not get reversed.

In order to perform a read operation, the block 64 is selected which includes the ferroelectric transistor from which the read operation is intended. That is, the selecting transistor 30 for controlling this block 64 is turned on. Thus, the source electrodes S of the ferroelectric transistors FT1 through FTn included in this selected block 64 become connected to the ground. Also, by connecting word lines WL1–WLn to the ground, the gate electrodes G of all the ferroelectric transistors included in this selected block 64 become connected to the ground. Then, by applying a read voltage to the drain electrodes D, that is, to the bit line BL, the value of the drain current is read out.

However, in the case of a read operation, all the selecting transistors included in the semiconductor storage device may be kept in an "on" status. This is because, though, for example, a read voltage of 1 V is applied across the gate and drain electrodes, the polarization of a ferroelectric does not get reversed by such a voltage.

In the cases of the first and third structures, let the electric capacitance of the region of the ferroelectric film 12 sandwiched between the second main electrode 18 and the gate electrode 10 be represented by Cs and let the electric capacitance of the region of the gate insulation film 14 sandwiched between the first main electrode 16 and the gate electrode 10 be represented by Chd. Then, the voltage Vg applied to the ferroelectric film 12 may be written as in the following equation (5):

$$Vg = -1/(1 + Cs/Chd) \qquad (5)$$

Since Cs/Chd=1, Vg=−0.5 (V). Thus, the electric field intensity applied to the ferroelectric film 12 is 12.5 (kV/cm) and, as being apparent from the hysteresis characteristics shown in FIG. 9, the polarization does not get reversed. The un-volatile storage is possible in this manner.

In the cases of the second and fourth structures, let the electric capacitance of the ferroelectric film 12 represented by Cf and let the electric capacitance of the region of the gate insulation film 14 sandwiched between the first main electrode 16 and the gate electrode 10 be represented by Cd. In these exemplary structures, the ratio between the electrode area capacitor area of the capacitors Cf and Cd is 10:1, which is set to v(=10). Then, the voltage Vg applied to the ferroelectric film 12 may be written as in the following equation (6):

$$Vg = -1/(1 + Cf/Cd) \qquad (6)$$

Since Cf/Cd=v×(200/0.4)/(25/0.05)=10, Vg=−0.09 (V). Thus, the electric field intensity applied to the ferroelectric film 12 is −2.25 (kV/cm) and, as being apparent from the hysteresis characteristics shown in FIG. 9, the polarization does not get reversed. Storing of data in an un-volatile manner is thus made possible.

(II) Description of the Manufacturing Method of the Ferroelectric Transistor

The manufacturing method of the ferroelectric transistors of the above-mentioned first to fourth exemplary structures will now be described. The method for manufacturing the first exemplary structure will firstly be explained and then explanations of the second to fourth structures will follow. With respect to the second to fourth structure, only those portions different from the first structure will be explained. Even in referring to different configurations or manufacturing steps, the same reference numerals will be given to the shared components among different structures.

[The Method for Manufacturing the First Structure]

Figure 14A:
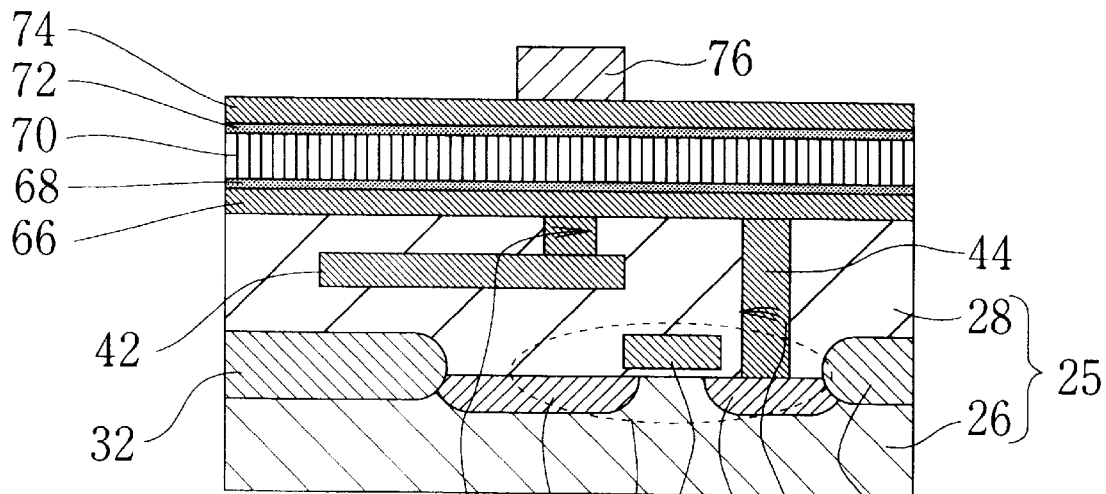
FIGS. 14(A) and 14(B), shows the steps for manufacturing the first structure of the semiconductor storage device.
Figure 14B:
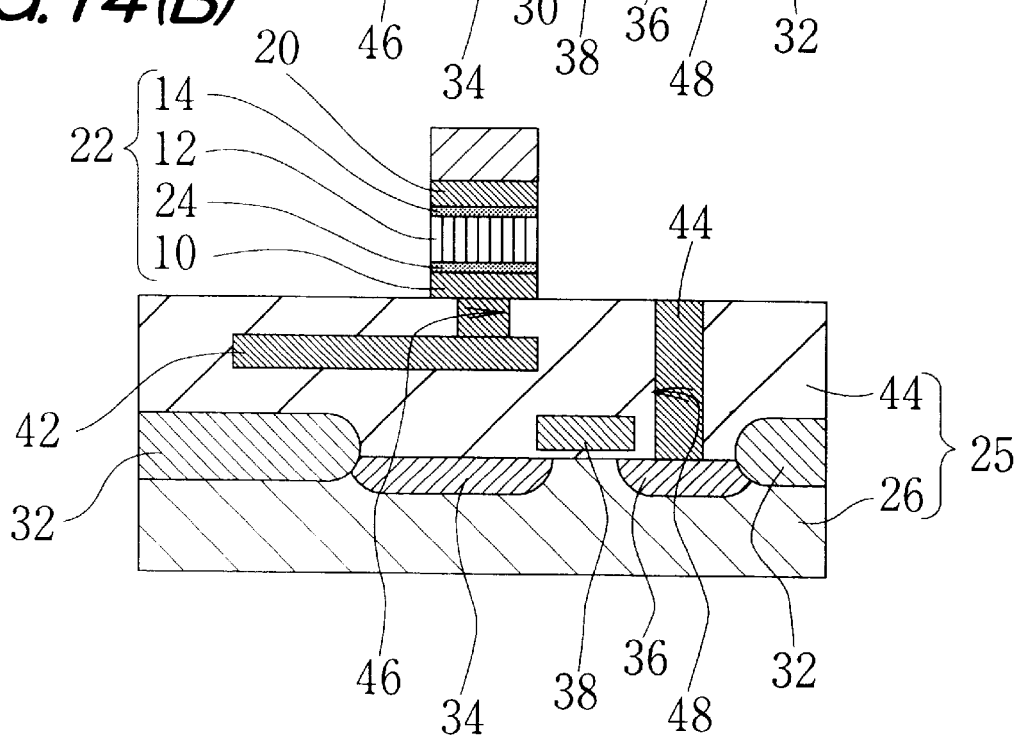

The method for manufacturing the first structure will now be described in referring to FIGS. 14 to 16. Each of the figures are cross sectional views cut along line I—I of FIG. 2.

To begin with, a MOSFET is formed on the substrate 26 by employing ordinary LSI techniques well-known to those skilled in the art. That is, the above-mentioned selecting transistor is formed on the surface of the substrate 26, which is a p⁻ type Si substrate in this case. Then, onto the substrate 26 having the selecting transistor 30 formed thereon, the interlayer insulation film 28, which has an appropriate thickness, is deposited by means of a suitable method. In this step, the first and second wirings 42 and 44 formed of tungsten are incorporated as underlying wirings. As seen above, this first wiring 42 is for the connection to the gate electrode 10. The second wiring 44 is for the connection to the first main electrode 16. The underlying structure 25 comprising the substrate 26 and the interlayer insulation film 28, is thus formed.

Additionally, the first and second through-holes 46 and 48 are formed at the predetermined locations in the interlayer insulation film 28. Then, vertically directed wirings of W are embedded into the first and second through-holes 46 and 48 as conductive plugs. In this embodiment, each of these conductive plugs is included in the first and second wirings 42 and 44. The upper portion of the layers and the lower portion of the layers are connected via these vertically directed wirings. As shown in FIG. 14 (A), the upper levels of each of the through-holes and the embedded conductive plugs are preferably identical with that of the upper surface of the interlayer insulation film 28.

Further, in order to restore the possible damage of the MOSFET (selecting transistor 30) on the Si substrate, the device is thermally processed in the atmosphere of hydrogen gas. This thermal process before the formation of the ferroelectric transistor prevents the characteristics of the ferroelectric material from being degraded.

Then, a first conductive layer 66, a second conductive layer 68, the ferroelectric layer 70, a first insulation layer 72 and a semiconductor layer 74 are sequentially deposited on the interlayer insulation film 28. These sequential steps will now be described in referring to FIG. 14 (A).

The first conductive layer 66 is formed on the interlayer insulation film 28. For this purpose, a W layer, which is uniformly 0.1 μm thick, is deposited as the first conductive layer 66 by a sputtering method. This W layer functions to reduce the gate resistance.

Then, the second conductive layer 68 is formed on the first conductive layer 66. For this purpose, an IrO$_2$ layer, which is 0.1 μm thick, is deposited as the second conductive layer 68 by a sputtering method. This IrO$_2$ layer will be used as an underlying structure or an underlying layer on which a ferroelectric layer is formed.

Next, the ferroelectric layer 70 is formed onto the first conductive layer 66, that is, onto the second conductive layer 68. In this case, by means of a sol-gel method, a SrBi$_2$Ta$_2$O$_9$ layer, which is 0.4 μm thick, is formed on the upper surface of the second conductive layer 68 as the ferroelectric layer 70. For this purpose, liquid containing the ferroelectric material is provided on the upper surface of the second conductive layer 68 by spin-coat technique. Organic components will be removed in a thermal process at the temperature of 450° C., and then, the device will be crystallized in a baking process at the temperature of 800° C.

Next, the first insulation layer 72 is formed on the ferroelectric layer 70. For this purpose, a Ta$_2$O$_5$ layer, which is 0.05 μm thick, is deposited on the upper surface of the ferroelectric layer 70 as the first insulation layer 72. In this case, this Ta$_2$O$_5$ layer is formed with a Ta target by a reactive sputtering in a mixture of Ar gas and O$_2$ gas.

This first insulation layer 72 is preferably formed of a highly dielectric material so that it will function as a gate insulation layer. The Ta$_2$O$_5$ layer used in this embodiment has the relative dielectric constant (ε) of 25 and is a highly dielectric material. Alternatively, this first insulation layer 72 may be formed of, for example, one or any combination selected from among $ZrO_2$ ($\epsilon$=22), $HfO_2$ ($\epsilon$=22) and $Si_3N_4$ ($\epsilon$=7). In this embodiment, the gate insulation film is formed of those materials with a higher relative dielectric constant than SiO2 (E=4). Accordingly, in this structure, a higher voltage is applied to the ferroelectric film than in case of prior art devices.

After the first insulation layer 72 is formed, the defects existing in the first insulation layer 72 are removed. In this embodiment, a thermal process is performed at the temperature of 500° C. in the atmosphere of oxygen gas so that the defects in the formed $Ta_2O_5$ are reduced. Thereby, the charge trap density is reduced.

Next, a semiconductor layer 74 is formed on the first insulation layer 72. In this embodiment, a polysilicon layer is deposited on the upper surface of the first insulation layer 72 as the semiconductor layer 74. For this purpose, this polysilicon layer is deposited by a plasma CVD process where $SiH_4$ gas and $H_2$ gas are used where and the temperature of the substrate is kept at 600° C. Thus, a polysilicon which is 0.4 $\mu$m thick is formed.

After the semiconductor layer 74 is deposited, a $SiO_2$ mask 76 is formed on the upper surface of the semiconductor layer 74 for the purpose of the patterning of the gate unit. The $SiO_2$ film is deposited by a plasma CVD process where a mixture of $SiH_4$ gas and $N_2O$ gas are used and where the temperature of the substrate is kept at 350° C. The thickness of this $SiO_2$ is appropriately set to be, for example, 0.8 $\mu$m. Then, the $SiO_2$ mask 76 is formed by an ordinary photolithography process and dry etching process. In this embodiment, this $SiO_2$ mask 76 is located at a region above the first through-hole 46.

Transfer steps where the pattern of the $SiO_2$ mask 76 is sequentially transferred onto the deposited semiconductor layer 74, the first insulation layer 72, the ferroelectric layer 70, the second conductive 68 and the first conductive layer 66 will now be described in referring to FIG. 14 (B).

In the embodiment, this transfer operations are collectively performed by a dry etching technique using the $SiO_2$ mask 76. That is, modification of the semiconductor layer 74 to form the channel layer 20 in the gate region, modification of the first conductive layer 72 to form the gate insulation film 14, the modification of the ferroelectric layer 70 to form the ferroelectric film 12 and modification of the first conductive layer 66 to form the gate electrode 10 are collectively performed. Incidentally, modification of the second insulation layer 68 to form the lower conductive layer 24 is included in the transfer operations between the seventh and eighth steps. The dry etching for this transfer operation is performed by generating a plasma with a combination of $Cl_2$ gas and Ar gas as well as a high frequency power of 13.56 MHz.

In the above-mentioned modification of the semiconductor layer 74 to form the channel layer 20, since the mask 76 is located above the first through-hole 46, a gate region is defined as an upper region of the first through-hole. That is, the channel layer 20 is formed at a region above the first through-hole 46. Also, as seen above, since the pattern of the $SiO_2$ mask 76 is transferred down sequentially, the gate unit 22 and the channel layer 20 are formed in the above-mentioned gate region, wherein the gate unit comprises the gate electrode 10, the lower conductive layer 24, the ferroelectric film 12 and the gate insulation film 14.

Further, a conductive plug is embedded in the first through-hole 46 and this conductive plug is connected to the first wiring 42. Thus, the gate electrode 10 automatically connected to the first wiring 42 is formed by the above-mentioned procedures. Also, by a patterning of the gate unit 22, an undesired portion of the first conductive layer 66 other than the gate region is removed, thereby exposing the upper surface of the interlayer insulation film 28. Accordingly, the gate electrode 10 is preferably separated from the second wiring 44.

Figure 15A:
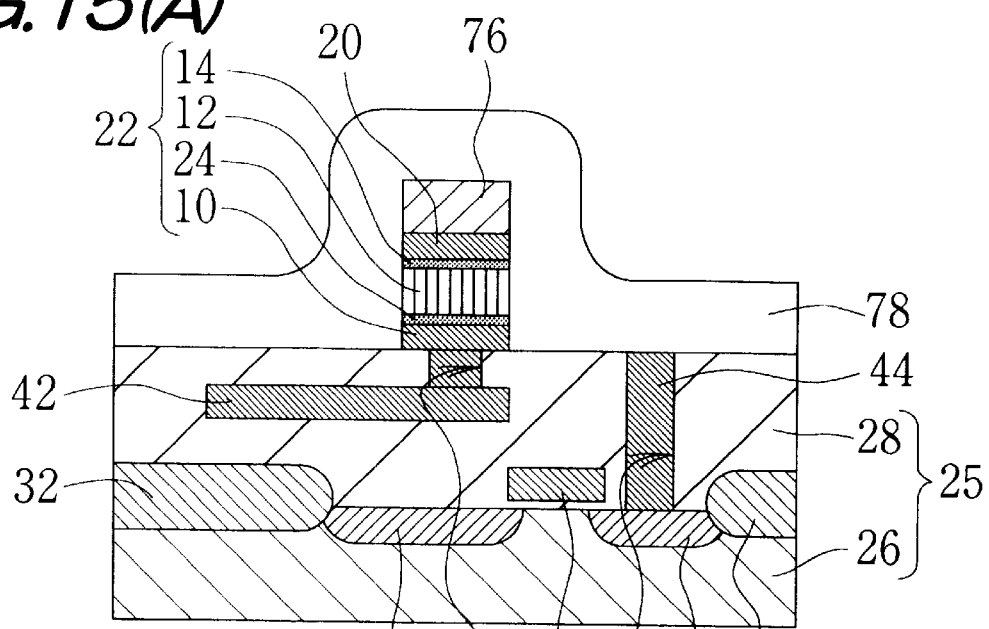
FIGS. 15(A) and 15(B), shows the steps for manufacturing the first structure following the steps of FIG. 14.
Figure 15B:
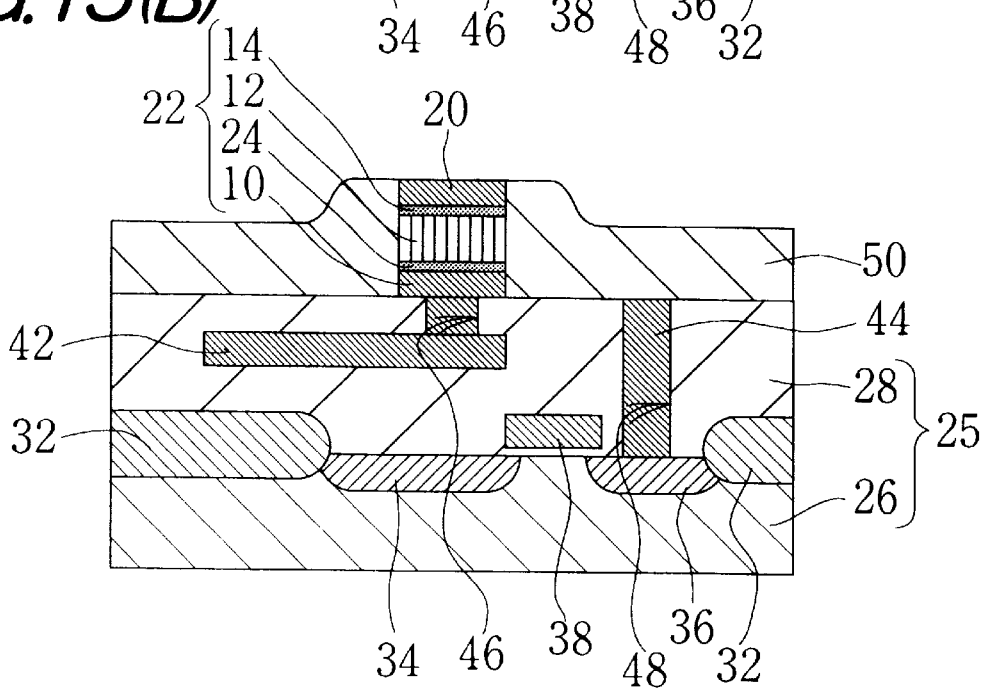

Then, following the modification of the first conductive layer 66 to form the gate electrode 10, the forming of the upper insulation film 50 on the interlayer insulation film 28 so that the upper insulation film makes contact with the side surfaces of the gate unit 22 and the channel layer 20 is performed as explained in reference to FIGS. 15 (A) and 15 (B).

A second insulation layer 78 is formed on the interlayer insulation film 28 so that the second insulation layer covers the side and upper surfaces of the gate unit 22 and the channel layer 20. For this purpose, using a plasma CVD method, a $SiO_2$ layer is formed over all the wafer including residual $SiO_2$ mask 76 as the second insulation layer 78. This plasma CVD is performed by using a mixture of $SiH_4$ gas and $N_2O$ gas and as a raw material gas by keeping the temperature of the substrate at 350° C. As the result, a $SiO_2$ layer which is 0.4 $\mu$m thick will be formed. Please see FIG. 15 (A).

Then, the second insulation layer 78 will be polished until the upper surface of the channel layer 20 is exposed so that the upper insulation film 50 will be formed. Please see FIG. 15 (B). The polishing of the second insulation layer 78 is done by the Chemical Mechanical Polishing (CMP) Method. By this polishing, the second insulation layer 78 is modified and becomes the upper insulation film 50. Since this polishing continues until the upper surface of the channel layer 20 is exposed, the height of such a portion of the upper insulation film 50 that makes contact with the channel layer 20 can be matched to the level of the upper surface of the channel layer 20.

Figure 16A:
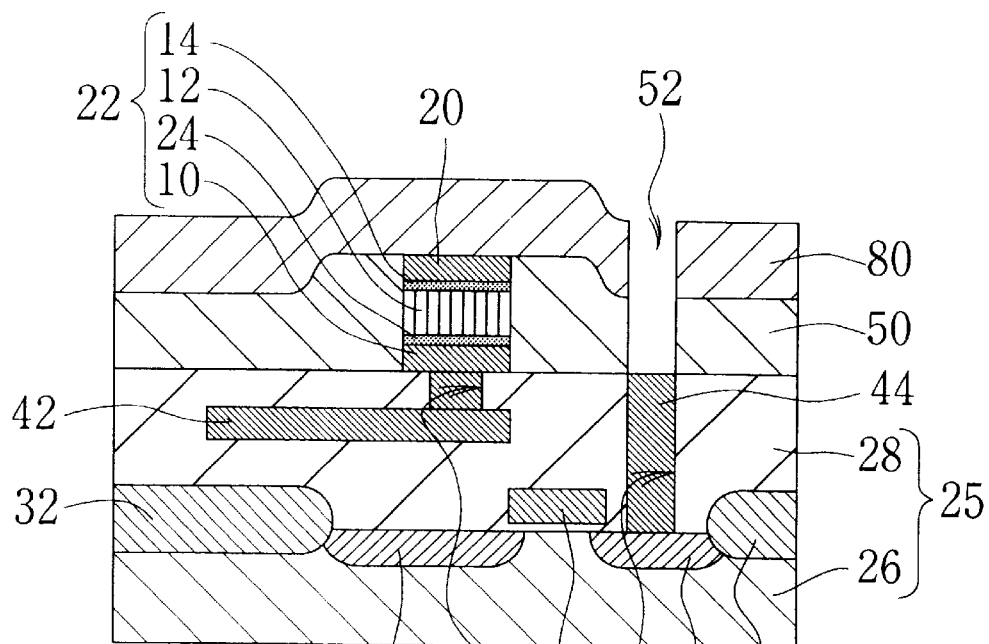
FIGS. 16(A) and 16(B), shows the steps for manufacturing the first structure following the steps of FIG. 15.
Figure 16B:
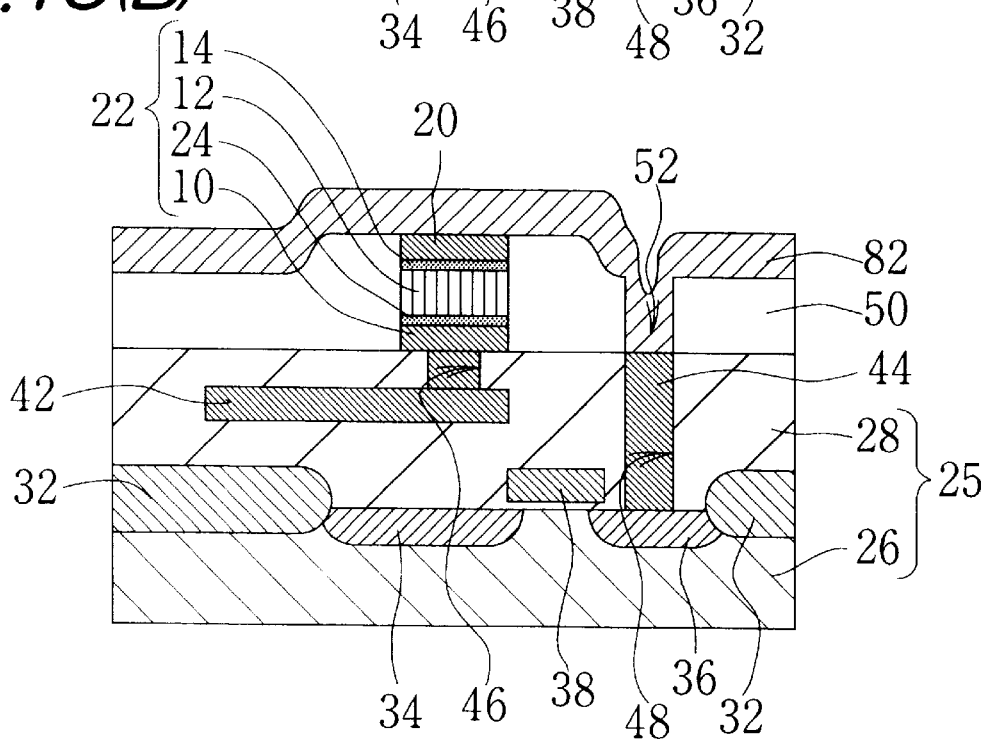

After this, a third through-hole is formed at such a region of the upper insulation film 50 that includes the second through-hole 48 (FIG. 16 (A)). For this purpose, a resist layer 80 is formed by deposition on the upper surface of the upper insulation film 50 and this resist layer 80 is processed by the photolithography technique. Then, by processing the upper insulation film 50 by means of a dry etching with the resist layer 80 as a mask, the third through-hole 52 is formed. From the third through-hole 52, a portion of the conductive plug (second wiring 44) embedded in the second through-hole 48 is guided above the upper surface of the upper insulation film 50. The resist layer 80 will be removed.

In order to form, the first and second main electrodes on the channel layer 20, a polysilicon layer 82 will be formed on the upper insulation film 50 where the third through-hole 52 is formed (FIG. 16 (B)). This polysilicon layer 82 is deposited by a plasma CVD using a mixture of $SiH_4$ gas, $PH_3$ gas and $H_2$ gas at the temperature of 500° C. In this embodiment, the thickness of the polysilicon layer 82 is set to be 0.4 $\mu$m.

Then, the polysilicon layer 82 will be processed in accordance with the ordinary procedures of resist deposition, photolithography and dry etching. By these processes, the first and second main electrodes 16 and 18 are formed (FIGS. 1 and 3).

After the first and second main electrodes 16 and 18 are formed, conventional methods will be used as in a prior art LSI manufacturing. The interlayer insulation film 54 is formed on the upper insulation film 50 on which the first and second main electrodes 16 and 18 will first be formed (FIG. 3). Then, after a through-hole is formed at a desired location in the interlayer insulation film 54, an Al alloy film will be deposited. By processing this Al alloy film, an Al wiring 56 will be formed (FIG. 3). Lastly, the wafer surface will be covered with and protected by a surface protection layer 58 (FIG. 3).

In the above described manufacturing method, after the ferroelectric layer 70 is formed, no thermal process at a temperature higher than 600° C. will be employed. Since a ferroelectric transistor of the first structure may be formed by the low temperature processes, the thermal hysteresis of the ferroelectric film 12 can be kept to a low level. Accordingly, since such problems as stresses generated on the ferroelectric film 12 because of thermal processes can be avoided, the ferroelectric characteristics (polarization reversal characteristics) will not be degraded. Also, because of the low temperature during the processes, the constituting elements of the ferroelectric film 12 will not diffuse in outer directions. Therefore, the characteristics of the selecting transistors 30 formed on the Si substrate will not be degraded.

Incidentally, in the fourth step, when an amorphous silicon layer is deposited on the first insulation layer as the semiconductor layer 74, a plasma CVD will be employed where the temperature of the substrate is kept at 300° C. and a mixture of $SiH_4$ gas and $H_2$ gas is used. Thus, a still lower temperature process will be possible in this case. This means that the ferroelectric characteristics will not be degraded. Further, though $SiO_2$ tends to be generated at the boundary between amorphous silicon and $Ta_2O_5$, $SiO_2$ will not be formed between the channel layer 20 and the gate insulation film 14 according to this method because the layers are formed at a lower temperature. Therefore, a high permittivity can be maintained.

[The Method for Manufacturing the Second Structure]

The method for manufacturing the second structure will now be explained by referring to FIG. 17. These figures show cross sectional views as being cut along I—I line of FIG. 5.

This method is different from the method for manufacturing the first structure (hereinafter simply referred to as the first manufacturing method) in that this method further comprises two procedures in addition to those of the first method. Since all the other procedures are substantially identical, the additional procedures will mainly be explained.

Figure 17A:
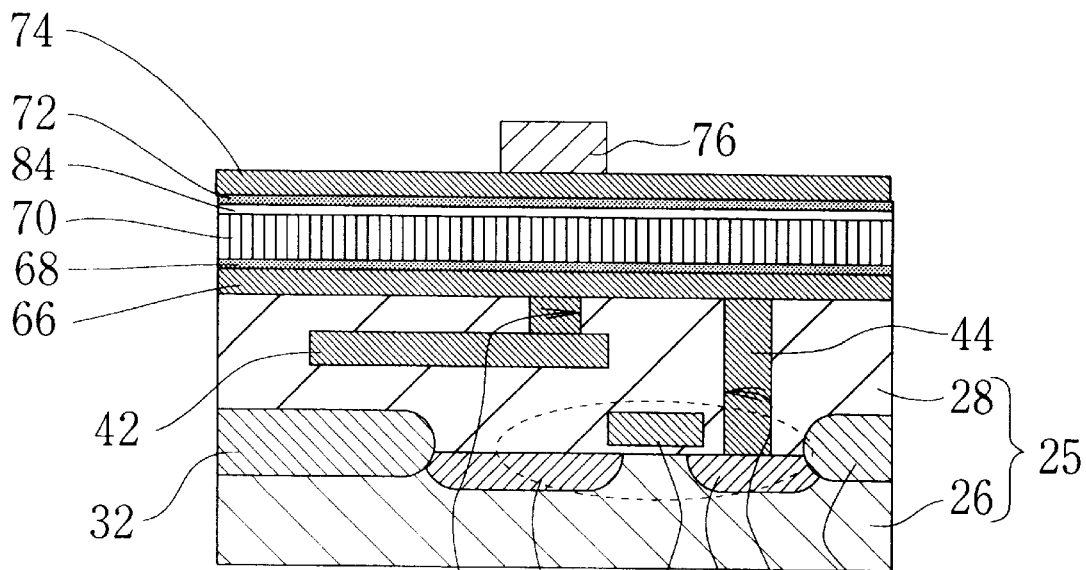
FIGS. 17(A) and 17(B), shows the steps for manufacturing the second structure.
Figure 17B:
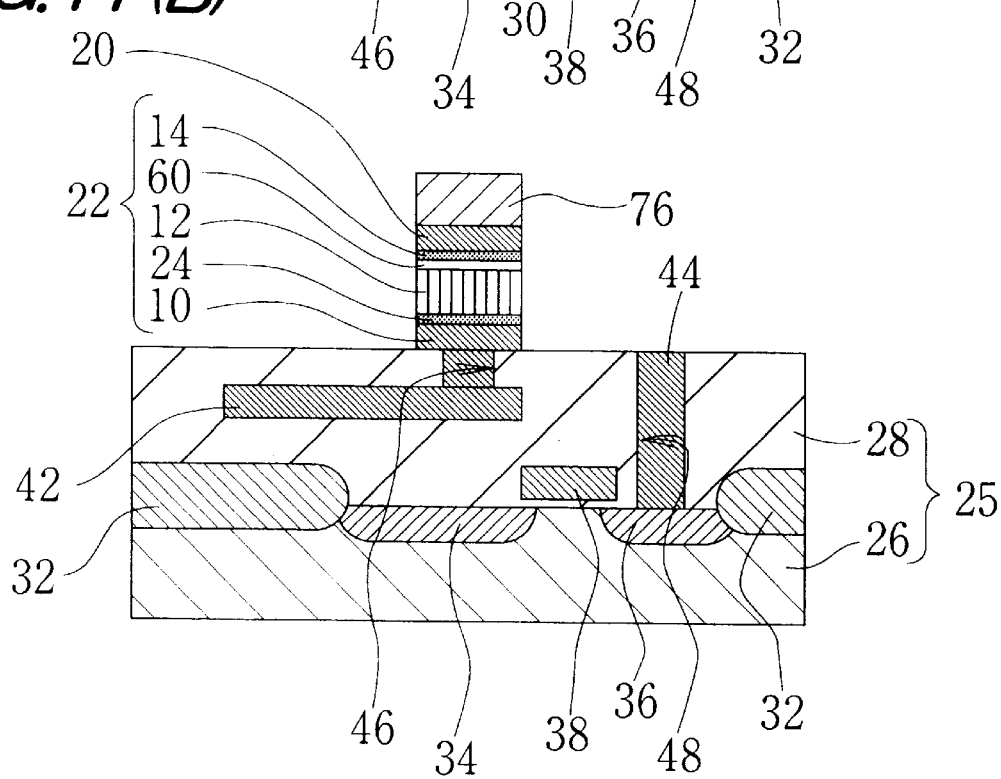

In this embodiment, between the above-mentioned formation of the dielectric layer and the formation of the first insulation layer 72, a third conductive layer 84 is formed on the ferroelectric layer 70 (FIG. 17 (A)). For this purpose, after the ferroelectric layer 70 is deposited, a $IrO_2$ layer having the thickness of 0.1 μm will be deposited on the upper surface of this ferroelectric layer 70 by sputtering as the third conductive layer 84. This $IrO_2$ layer functions to prevent the ferroelectric layer 70 from being degraded in the thermal process performed in forming this device.

Further, in the formation of the first insulation layer 72, the first insulation layer 72 will be formed on this third conductive layer 84.

Additionally, between the modification of the first conductive layer 72 and the modification of the ferroelectric layer 70, the third conductive layer 84 is modified to form the upper conductive layer 60 will be inserted (FIG. 17 (B)). This modification will be collectively performed together with other layers by the above-mentioned transfer operation. As the result, the gate unit 22 containing the upper conductive layer 60 will be formed.

[The Method for Manufacturing the Third Structure]

The method for manufacturing the third structure will now be explained by referring to FIG. 18. These figures show cross sectional a views as being cut along I—I line of FIG. 2.

This method is different from the first manufacturing method in that this method further comprises two more procedures as well as all the procedures of the first method. Since all the other procedures are substantially identical, the additional procedures will mainly be explained.

Figure 18A:
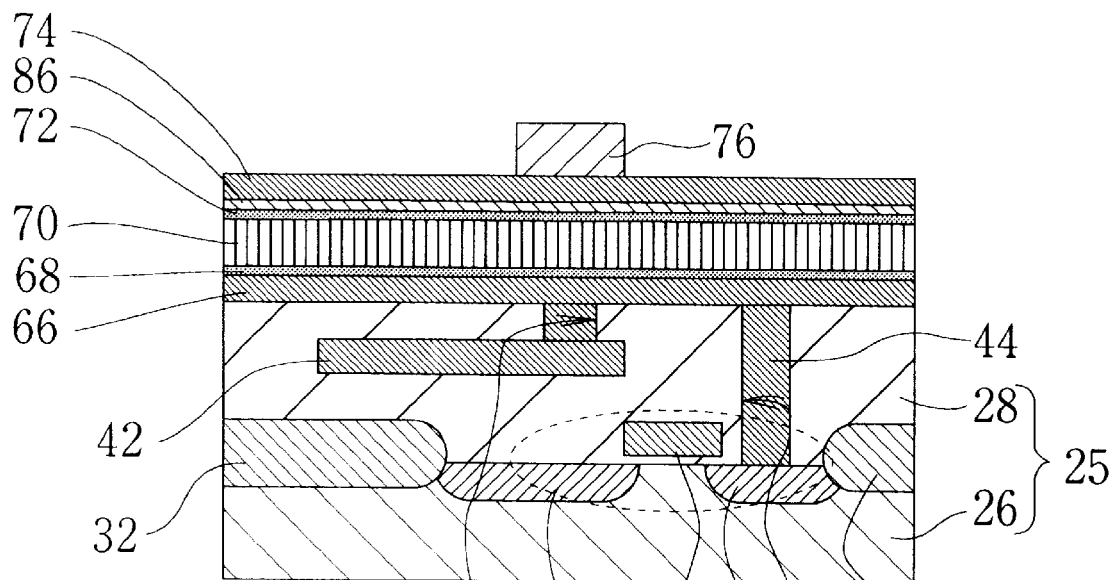
FIGS. 18(A) and 18(B), shows the steps for manufacturing the third structure.
Figure 18B:
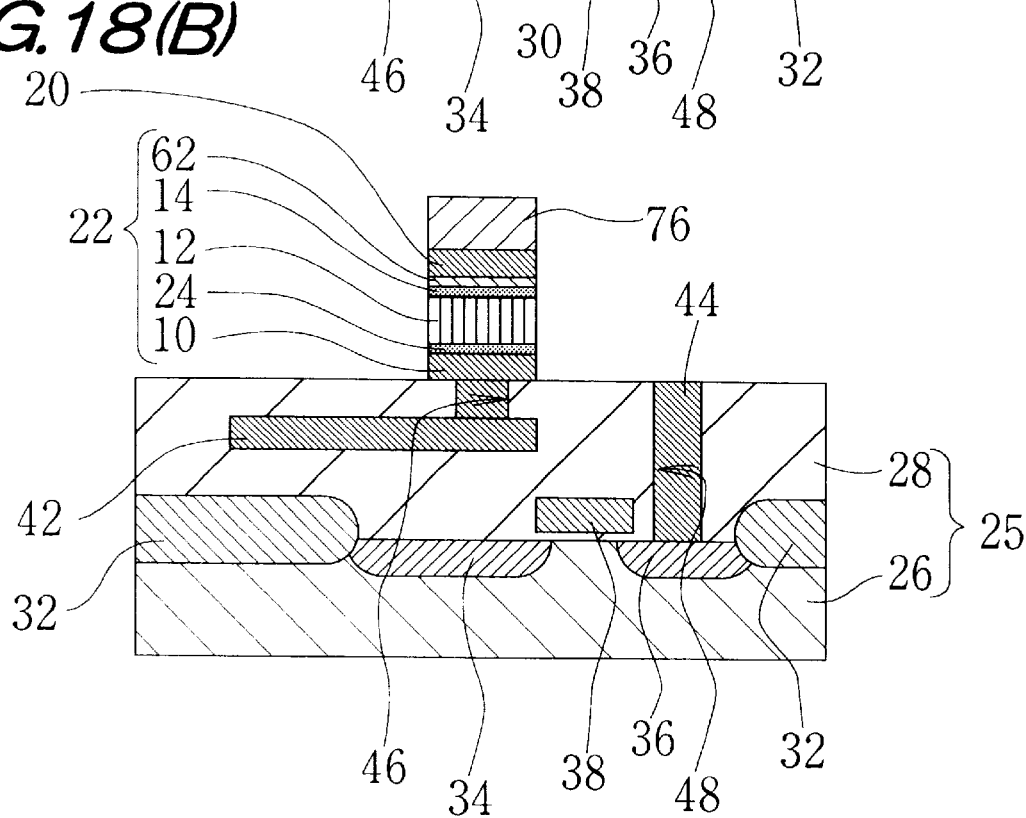

In this embodiment, between the above-mentioned formation of the insulation layer 72 and the formation of the semiconductor layer 74, a metal oxide layer 86 is formed on the first insulation layer 72, where the heat of formation of the oxide of the metal oxide layer is small compared to the semiconductor layer 74 (FIG. 18 (A)). A $ZrO_2$ layer as this metal oxide layer 86 is deposited by a reactive sputtering process by a mixture of Ar gas and $O_2$ gas in which a Zr target is used. In this embodiment, this $ZrO_2$ layer is uniformly deposited with the thickness of 0.01 μm.

Then, in the fourth step, a polysilicon layer is formed on this metal oxide layer 86 as the semiconductor layer 74. As seen above, this polysilicon layer is deposited at a high temperature environment of approximately 600° C. Thus, it used to be possible in prior art techniques that the $Ta_2O_5$ layer formed as the first insulation layer 72 is reduced by Si and that $SiO_2$ may be formed in the channel layer 20. In this method, however, since the upper side of the first insulation layer 72 is covered with the metal oxide 86, the first insulation layer 72 is not reduced by Si. Further, since the heat of formation of the metal oxide layer 86 is lower compared with the semiconductor layer 74, the metal oxide layer 86 does not get reduced by Si. Therefore, since it is possible in this method for $SiO_2$ not to be formed on the channel layer 20, the permittivity of all the gate unit 22 may be maintained at a certain level without letting it decrease.

After the formation of the metal oxide layer 86, defects possibly existing in this metal oxide layer 86 will be removed. For this purpose, the device is thermally processed in the atmosphere of oxygen at the temperature of 500° C. By this thermal process, defects in the $Ta_2O_5$ layer as well as those in the $ZrO_2$ layer can be removed. As the result, the charge carrier densities of both the $ZrO_2$ and $Ta_2O_5$ layers can be decreased.

Further, between the above-mentioned modification of the semiconductor layer 74 and the modification of the first conductive layer 72, the metal oxide layer 86 is modified. This modification is collectively performed together with the other layers by the above-mentioned transfer operation, thereby resulting in the formation of the metal oxide 62 (FIG. 18 (B)).

As explained above, according to this method, the reduction of the first insulation layer 72 may be avoided as well as the merit of the first method can be obtained. Thus, the degradation of the ferroelectric characteristics may be avoided.

Incidentally, if amorphous silicon is employed as the semiconductor layer 74, the reduction of the first insulation layer 72 can be avoided by forming the metal oxide layer 86 as a $ZrO_2$ layer.

Also, in this third structure, $Ta_2O_5$ layer as the gate insulation layer 14 may not be necessary because the $ZrO_2$ layer can be used as a highly dielectric layer.

[The Method for Manufacturing the Fourth Structure]

The method for manufacturing the fourth structure will now be explained by referring to FIG. 19. These figures show cross sectional views as being cut along I—I line of FIG. 5.

This method is different from the first manufacturing method in that this method further comprises four more procedures as well as all the procedures of the first method. Since all the other procedures are substantially identical, the additional procedures will mainly be explained.

Figure 19A:
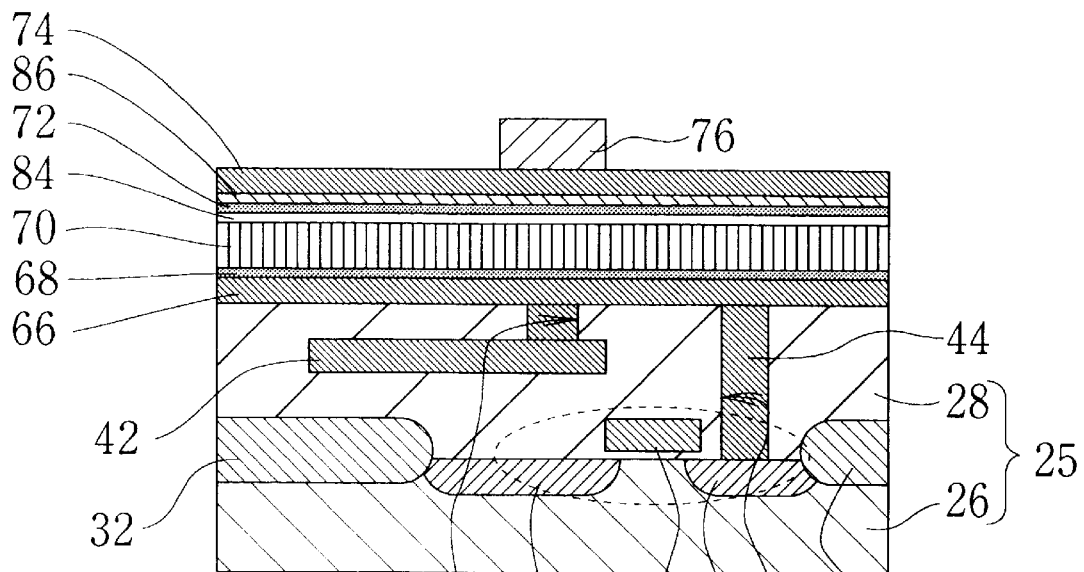
FIGS. 19(A) and 19(B), shows the steps for manufacturing the fourth structure.
Figure 19B:
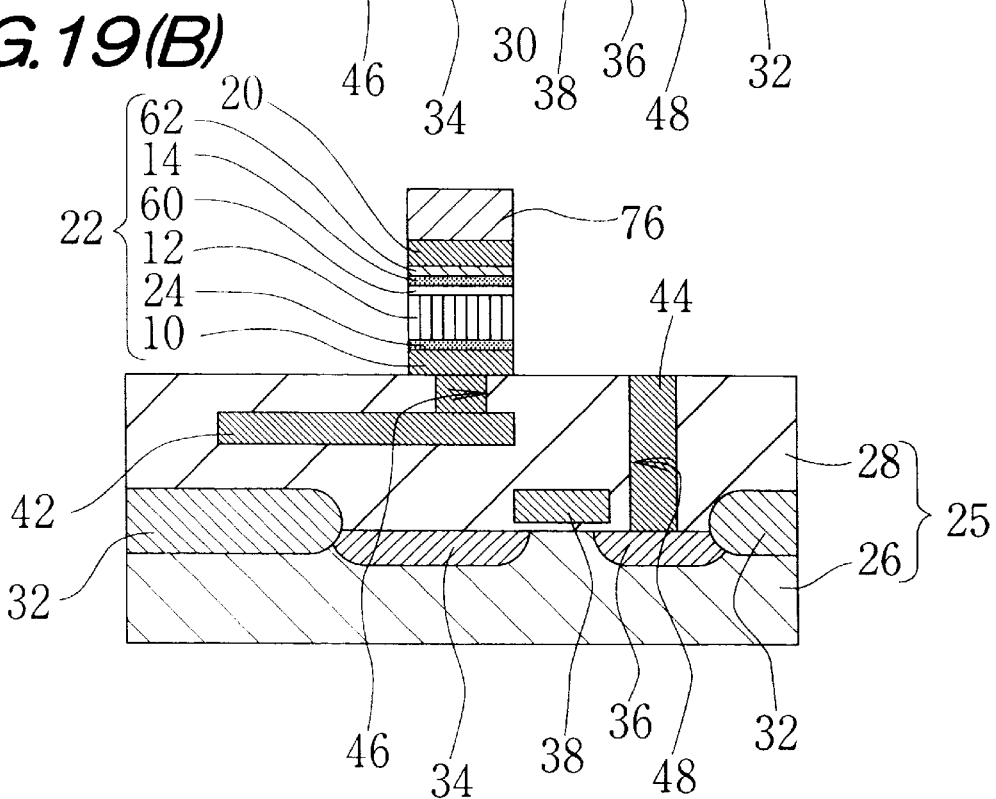

In this embodiment, between the above-mentioned formation of the ferroelectric layer 70 and the formation of the first insulation layer 72, the third conductive layer 84 on the ferroelectric layer 70 is modified (FIG. 19 (A)). For this purpose, after the ferroelectric layer 70 is deposited, a IrO$_2$ layer having the thickness of 0.1 µm will be deposited on the upper surface of this ferroelectric layer 70 by sputtering as the third conductive layer 84. This IrO$_2$ layer functions to prevent the ferroelectric layer 70 from being degraded in the thermal process performed in forming this device.

Further, in the formation of the first insulation layer 72, the first insulation layer 72 will be formed on this third conductive layer 84.

In this embodiment, between the above-mentioned formation of the insulation layer 72 and the formation of the semiconductor layer 74, the metal oxide layer 86 is formed on the first insulation layer 72, where the heat of formation of the metal oxide layer is small compared to the semiconductor layer 74 (FIG. 19 (A)). A ZrO$_2$ layer as this metal oxide layer 86 is deposited by a reactive sputtering process by a mixture of Ar gas and O$_2$ gas in which a Zr target is used. In this embodiment, this ZrO$_2$ layer is uniformly deposited with the thickness of 0.01 µm.

Then, in the formation of the semiconductor layer 74, a polysilicon layer is formed on this metal oxide layer 86 as the semiconductor layer 74. Thus, in this method, since the upper side of the first insulation layer 72 is covered with the metal oxide 86, the first insulation layer 72 is not reduced by Si. Further, since the heat of formation of the metal oxide layer 86 is lower compared with the semiconductor layer 74, the metal oxide layer 86 does not get reduced by Si. Therefore, since SiO$_2$ is not formed, the permittivity of all the gate unit 22 may be maintained at a certain level without letting it decrease.

After the formation the of metal oxide layer 86, defects possibly existing in this metal oxide layer 86 will be removed. For this purpose, the device is thermally processed in the atmosphere of oxygen at the temperature of 500° C. By this thermal process, defects in the Ta$_2$O$_5$ layer as well as those in the ZrO$_2$ layer can be removed. As the result, the charge carrier densities of both the ZrO$_2$ and Ta$_2$O$_5$ layers can be decreased.

Further, between the above-mentioned modification of the semiconductor layer 74 and the modification of the first conductive layer 72, the metal oxide 86 is modified. This modification will be collectively performed together with other layers by the above-mentioned transfer operation. As the result, the metal oxide layer 62 will be formed (FIG. 19 (B)).

Additionally, in this embodiment, between the modification of the fist conductive layer 72 and the modification of the ferroelectric layer 70 the third conductive layer 84 is modified to form the upper conductive layer 60 will be inserted (FIG. 19 (B)). This modification will be collectively performed together with other layers by the above-mentioned transfer operation. As the result, the gate unit 22 containing the upper conductive layer 60 will be formed.

As explained above, according to this method, the reduction of the first insulation layer 72 may be avoided as well as the merit of the first method can be obtained. Thus, the degradation of the ferroelectric characteristics may be avoided.

Incidentally, if amorphous silicon is employed as the semiconductor layer 74, the reduction of the first insulation layer 72 can be avoided by forming the metal oxide layer 86 as a ZrO$_2$ layer.

Also, in this fourth structure, the Ta$_2$O$_5$ layer as the gate insulation layer 14 may not be necessary because the ZrO$_2$ layer can be used as a highly dielectric layer.

As being apparent from the foregoing description, the ferroelectric transistor of this invention comprises (1) a gate unit, which has a gate electrode, a ferroelectric film and a gate insulation film (or gate dielectric film) deposited in this order, (2) a channel layer on the gate insulation layer and (3) a first and a second main electrodes on the channel layer, wherein the channel layer is used as a channel. In this structure, the diffusion of the constituting elements of the ferroelectric in a thermal process may be avoided, the wiring or the interconnection may be simpler, the device may be controlled in an easier manner, and an integration to a further microscopic level may be possible. Thus, the device of this invention will be quite effective in a further integration and a higher operation of an integrated circuit, thereby improving the capability of the circuit.

Also, in accordance with the present invention, the gate insulation film is formed of any one material or any combination of more than one material selected from among Ta$_2$O$_5$, ZrO$_2$, HfO$_2$, Si$_3$N$_4$, CeO$_2$ and Ba$_x$Sr$_{1-x}$TiO$_3$ (x is a positive integer). All these materials have a higher relative dielectric constant than SiO$_2$ which is used for a normal gate insulation layer. Therefore, it is possible to apply a higher voltage to the ferroelectric film than in the case of prior art devices.

In accordance with the invention, the gate unit has an upper conductive layer between the gate insulation layer and the ferroelectric layer. Thanks to this upper conductive layer, the degradation of the ferroelectric film can be avoided even in a thermal process.

Further, in accordance with the invention, the area of the portion where the first main electrode makes contact with the channel layer is different from that of the portion where the second main electrode makes contact with the channel layer. By thus appropriately setting the contacting areas of the first main electrode and channel layer, the electric capacitance of the gate insulation film can effectively be adjusted. Therefore, the level of the signal voltage to be applied to the ferroelectric film can be suitably controlled.

Further, in accordance with the invention the gate unit has a metal oxide layer between the channel layer and the gate insulation layer. And the metal oxide layer is formed of a material the heat of formation of the oxide of which is smaller than that of the channel layer. By thus covering the gate insulation film with a metal oxide layer, the gate insulation film may not be reduced.

Next, the semiconductor storage device in accordance with the invention has the above-mentioned ferroelectric transistors as its storage elements. Thus, the semiconductor storage device using the ferroelectric transistors is effective toward large scale storage devices, a miniaturization of the device and a higher operation speed of the device.

Further, in accordance with the present invention, the semiconductor storage device comprises selecting transistors each of which is respectively assigned to. Each of the blocks each of which is formed with an appropriate number of the ferroelectric transistors. And, in each of the blocks, the gate electrode of the ferroelectric transistor is connected to the predetermined one of the word lines, the first main electrode of the ferroelectric transistor is connected to the predetermined one of the bit lines, the second main electrode of the ferroelectric transistor is connected to the first main electrode of the selecting transistor and the second main electrode of the selecting transistor is connected to the ground. Thus, by controlling the switching status of the selecting transistor, any block may be selected. Further, by specifying a word line, an arbitrary ferroelectric transistor included in the block may be specified and data may be written into, flashed from and read out of the transistor.

Also, in accordance with a method of operating the ferroelectric transistor of the invention, data may be written into the ferroelectric film by opening the first main electrode and applying a write voltage across the second main electrode and the gate electrode.

Also, in accordance with a method of operating the ferroelectric transistor of the invention, data may be erased from the ferroelectric film by opening the first main electrode and applying an erase voltage across the second main electrode and the gate electrode.

Also, in accordance with a method of operating the ferroelectric transistor of the invention, data may be read out of the ferroelectric film by connecting the gate electrode to the ground and applying a read voltage across the first and second main electrodes.

As seen above, data may be written into, erased from and read out of the above-mentioned ferroelectric transistor via three electrode terminals. This means that it is no longer necessary to control the substrate potential, which was required in prior art devices. Thus, wiring process is far simplified compared to prior art devices and the device can be controlled more easily.

Alternatively, in accordance with a method of manufacturing the ferroelectric transistor of the present invention, a deposited layer structure having a first conductive layer, a ferroelectric layer, a first insulation layer and a semiconductor layer deposited on an underlying structure in this order. As the result of such a structure, (1) a gate unit comprising a gate electrode, a ferroelectric film and a gate insulation film and (2) a channel layer are formed. Then, conductive layers that will be a first main electrode and a second main electrode are formed on the channel layer. Since a ferroelectric layer is formed prior to a semiconductor layer, the constituting elements of the ferroelectric material will not be diffused in outer directions even in a thermal process, which is different from the case in prior art devices. Therefore, the degradation of the MOSFET characteristics, which used to occur in prior art devices, can be avoided.

Further, in accordance with a method of manufacturing the ferroelectric transistor of the present invention, between the formation of the ferroelectric layer 70 and the formation of the first insulation layer 72, a third conductive layer is formed on the ferroelectric layer is inserted. Between the modification of the first conductive layer 72 and the modification of the ferroelectric 70, the third conductive layer is modified to form an upper conductive layer. By thus forming the third conductive layer (upper conductive layer), the degradation of the ferroelectric material can be avoided in a thermal process.

Further, in accordance with a method of manufacturing the ferroelectric transistor of the present invention, between the formation of the insulation layer 72 and the formation of the semiconductor layer 74 a metal oxide layer on the first insulation layer is modified, where the heat of formation of the metal oxide layer is small compared to the semiconductor layer. Further, between the modification of the semiconductor layer 74 and the modification of the first conductive layer 72 of modifying the metal oxide layer is formed. By thus forming such a metal oxide layer, since the heat of formation of the metal oxide layer is small compared to the semiconductor layer, the first insulation layer is not reduced by the constituting elements of the semiconductor layer.

Having illustrated and described the principles of the invention in several preferred embodiments thereof, it should be readily apparent to those skilled in the art that the above illustration and description are not intended to limit the invention and that the invention can be changed, modified or improved in arrangement and details without departing from such principles. Therefore, all such changes, modifications or improvements should come within the spirit and scope of the accompanying claims and the invention is defined and limited only by the following claims and its equivalents.

What is claimed is:

1. A ferroelectric transistor comprising:

a gate unit including
      an underlying layer,
      a gate electrode deposited on said underlying layer,
      a gate insulation film,
      a ferroelectric film, and
      an upper conductive layer between said gate insulation film and said ferroelectric film,
      wherein said gate electrode, said ferroelectric film, and said gate insulation film are deposited in order on said underlying layer;

a channel layer deposited on said gate insulation film of said gate unit operable to control a carrier density by spontaneous polarization of said ferroelectric film; and first and second main electrodes spaced apart from each other on said channel layer.

2. A ferroelectric transistor as claimed in claim 1, wherein said gate unit includes a lower conductive layer between said ferroelectric film and said gate electrode.

3. A ferroelectric transistor as claimed in claim 2, wherein said lower conductive layer is formed of any one material or any combination of more than one material selected from among $IrO_2$, Ir, Ru, Pt, $RuO_2$, $SrRuO_3$, $La_{1-x}Sr_xCoO_{31}$ wherein x is a positive integer, and $SrMoO_3$.

4. A ferroelectric transistor as claimed in claim 1, wherein:

said gate unit includes a metal oxide layer between said channel layer and said gate insulation layer; and said metal oxide layer is formed of a material having a heat of oxide formation which is smaller than a heat of oxide formation of said channel layer.

5. A ferroelectric transistor as claimed in claim 4, wherein said metal oxide layer is formed of any one material or any combination of more than one material selected from among $ZrO_2$l $TiO_2$, $HfO_2$, and $Al_2O_3$.

6. A ferroelectric transistor as claimed in claim 1, wherein said upper conductive layer is formed of any one material or any combination of more than one material selected from among $IrO_2$, Ir, Ru, Pt, $RuO_2$, $SrRuO_3$, $La_{1-x}Sr_xCoO_3$, wherein x is a positive integer, and $SrMoO_3$.

7. A ferroelectric transistor as claimed in claim 1, wherein said first and second main electrodes are formed of polysilicon or amorphous silicon.

8. A ferroelectric transistor as claimed in claim 1, wherein said first and second main electrodes are formed as regions doped with impurities on said channel layer.

9. A ferroelectric transistor as claimed in claim 1, wherein said gate electrode is formed of any one material selected from among W, Ta, Mo, TiN, Nb, V, TaN, TaSiN, TiW, TiWN, and TiAlN.

10. A ferroelectric transistor comprising:
a gate unit including
an underlying layer,
a gate electrode deposited on said underlying layer,
a gate insulation film,
a ferroelectric film, and
an upper conductive layer between said gate insulation film and said ferroelectric film,
wherein said gate electrode, said ferroelectric film, and said gate insulation film are deposited in order on said underlying layer;
a channel layer deposited on said gate insulation film of said gate unit operable to control a carrier density by spontaneous polarization of said ferroelectric film; and
first and second main electrodes spaced apart from each other on said channel layer, wherein an area of said channel layer which contacts said first main electrode is different than an area of said channel layer which contacts said second main electrode.

11. A ferroelectric transistor as claimed in claim 10, wherein said gate unit includes a lower conductive layer between said ferroelectric film and said gate electrode.

12. A ferroelectric transistor as claimed in claim 11, wherein said lower conductive layer is formed of any one material or any combination of more than one material selected from among $IrO_2$, Ir, Ru, Pt, $RuO_2$, $SrRuO_3$, $La_{1-x}Sr_xCoO_3$, wherein x is a positive integer, and $SrMoO_3$.

13. A ferroelectric transistor as claimed in claim 10, wherein:
said gate unit includes a metal oxide layer between said channel layer and said gate insulation layer; and
said metal oxide layer is formed of a material having a heat of oxide formation which is smaller than a heat of oxide formation of said channel layer.

14. A ferroelectric transistor as claimed in claim 13, wherein said metal oxide layer is formed of any one material or any combination of more than one material selected from among $ZrO_2$, $TiO_2$, $HfO_2$, and $Al_2O_3$.

15. A ferroelectric transistor as claimed in claim 10, wherein said upper conductive layer is formed of any one material or any combination of more than one material selected from among $IrO_2$, Ir, Ru, Pt, $RuO_2$, $SrRuO_3$, $La_{1-x}Sr_xCoO_3$, wherein x is a positive integer, and $SrMoO_3$.

16. A ferroelectric transistor as claimed in claim 10, wherein said first and second main electrodes are formed of polysilicon or amorphous silicon.

17. A ferroelectric transistor as claimed in claim 10, wherein said first and second main electrodes are formed as regions doped with impurities on said channel layer.

18. A ferroelectric transistor as claimed in claim 10, wherein said gate electrode is formed of any one material selected from among W, Ta, Mo, TiN, Nb, V, TaN, TaSiN, TiW, TiWN, and TiAlN.

* * * * *

UNITED STATES PATENT AND TRADEMARK OFFICE
CERTIFICATE OF CORRECTION

PATENT NO.    : 6,107,656
DATED         : August 22, 2000
INVENTOR(S)   : Yasushi Igarashi It is certified that error appears in the above-identified patent and that said Letters Patent is hereby corrected as shown below:

Column 30,
Line 52, please change the term "$ZrO_2 1TiO_2$" to -- $ZrO_2, TiO_2$ --.

Signed and Sealed this

Twenty-eighth Day of May, 2002

Attest:

JAMES E. ROGAN
Attesting Officer     Director of the United States Patent and Trademark Office